(12) United States Patent
Yamazaki et al.

(10) Patent No.: US 8,518,755 B2
(45) Date of Patent: Aug. 27, 2013

(54) METHOD FOR MANUFACTURING SEMICONDUCTOR DEVICE

(75) Inventors: Shunpei Yamazaki, Setagaya (JP);
Hiroki Ohara, Sagamihara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 108 days.

(21) Appl. No.: 13/029,173

(22) Filed: Feb. 17, 2011

(65) Prior Publication Data

US 2011/0212570 A1 Sep. 1, 2011

(30) Foreign Application Priority Data

Feb. 26, 2010 (JP) ................. 2010-043555

(51) Int. Cl.
*H01L 21/84* (2006.01)
*H01L 21/00* (2006.01)
*H01L 21/331* (2006.01)
*H01L 21/322* (2006.01)

(52) U.S. Cl.
USPC ........... 438/149; 438/151; 438/161; 438/164; 438/370; 438/473; 257/E21.372; 257/E21.411; 257/E21.476

(58) Field of Classification Search
USPC .................. 257/E21.372, E21.411, E21.476
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

International Search Report (Application No. PCT/JP2011/053311) Dated Apr. 26, 2011.

(Continued)

*Primary Examiner* — Mohsen Ahmadi
(74) *Attorney, Agent, or Firm* — Eric J. Robinson; Robinson Intellectual Property Law Office, P.C.

(57) ABSTRACT

It is an object to provide a highly reliable semiconductor device, a semiconductor device with low power consumption, a semiconductor device with high productivity, and a method for manufacturing such a semiconductor device. Impurities left remaining in an oxide semiconductor layer are removed without generating oxygen deficiency, and the oxide semiconductor layer is purified to have an extremely high purity. Specifically, after oxygen is added to the oxide semiconductor layer, heat treatment is performed on the oxide semiconductor layer to remove the impurities. In order to add oxygen, it is preferable to use a method in which oxygen having high energy is added by an ion implantation method, an ion doping method, or the like.

19 Claims, 17 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,129,719 B2 * | 3/2012 | Yamazaki et al. | 257/43 |
| 8,278,136 B2 | 10/2012 | Tanaka et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142887 A1 | 6/2009 | Son et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0294765 A1 | 12/2009 | Tanaka et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0207119 A1 * | 8/2010 | Sakata et al. | 257/43 |
| 2010/0213460 A1 | 8/2010 | Kondo et al. | |
| 2010/0252826 A1 * | 10/2010 | Yamazaki et al. | 257/43 |
| 2011/0003429 A1 * | 1/2011 | Oikawa et al. | 438/104 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-053164 | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2008-060419 | 3/2008 |
| JP | 2008-060419 A | 3/2008 |
| JP | 2009-290113 A | 12/2009 |
| JP | 2010-028021 A | 2/2010 |
| WO | WO-2004/114391 | 12/2004 |

OTHER PUBLICATIONS

Written Opinion (Application No. PCT/JP2011/053311) Dated Apr. 26, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1229-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn-O TFTs for Flat Panel Displays,", AM-FPD '08 Digest of Technical Papres, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Device Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OOLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digst '09 : SID International Symposium Digest of Technical Papers, May 31, 2009, pp. 578-581.

Asaoka.Y et al., "29.1:Polarizer-Free Reflective LCD Combined With ULTRA Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,Or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

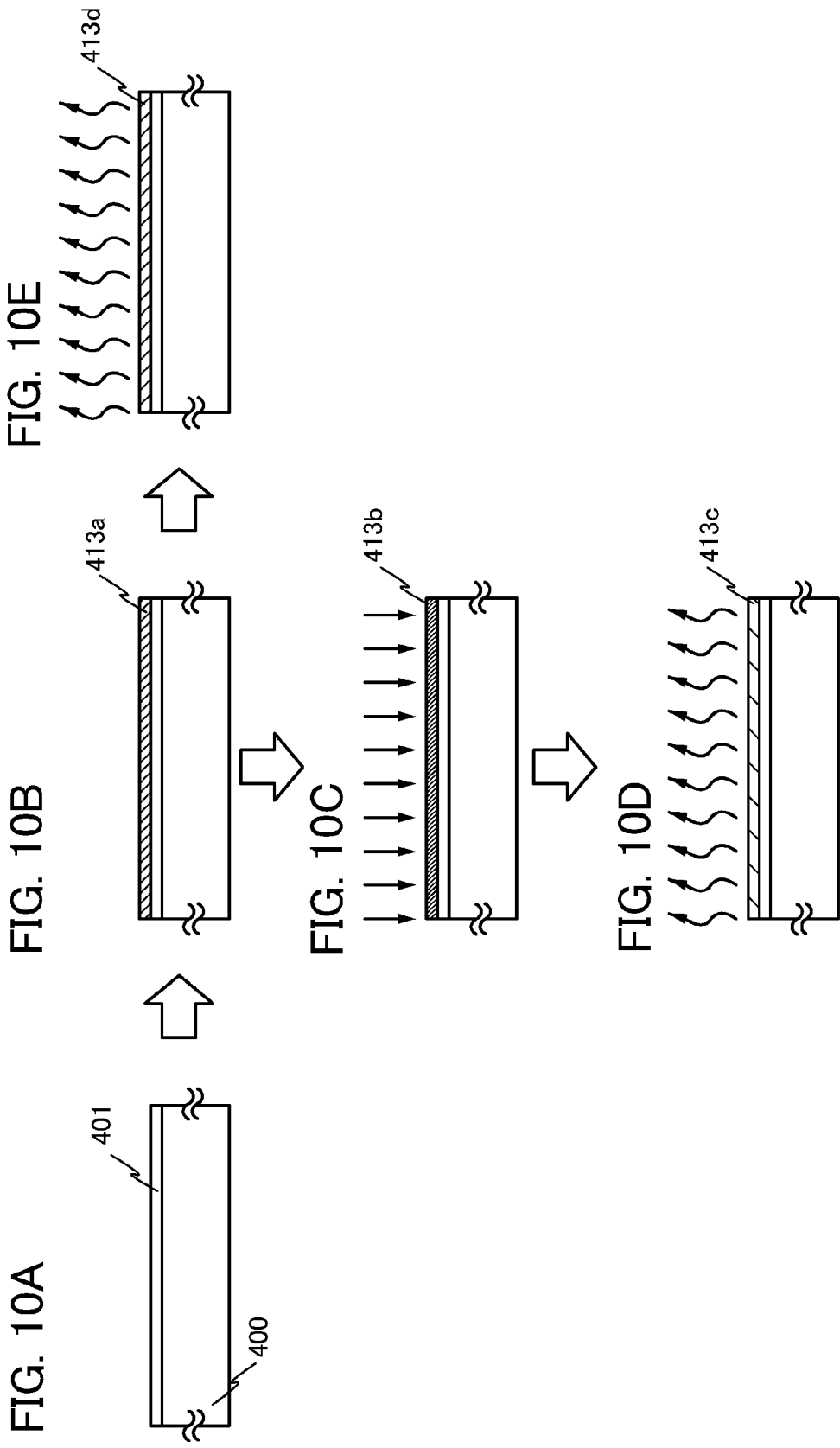

METHOD FOR MANUFACTURING SEMICONDUCTOR DEVICE

TECHNICAL FIELD

The present invention relates to a method for manufacturing a semiconductor device including an oxide semiconductor. In this specification, a semiconductor device generally refers to an element or a device which functions by utilizing semiconductor characteristics.

BACKGROUND ART

A technique in which a transistor is formed using a semiconductor layer formed over a substrate having an insulating surface is known. For example, a technique in which a transistor is formed over a glass substrate using a thin film containing a silicon-based semiconductor material and applied to a liquid crystal display device and the like is known.

A transistor used for a liquid crystal display device is mainly formed using a semiconductor material such as amorphous silicon or polycrystalline silicon. Although a transistor formed using amorphous silicon has low field-effect mobility, it can be formed over a larger glass substrate. Meanwhile, a transistor formed using polycrystalline silicon has high field-effect mobility; however, it needs a crystallization process such as laser annealing and it is not always suitable for a larger glass substrate.

An oxide semiconductor has attracted attention as another material which can be formed over a substrate having an insulating surface and used for forming a transistor. As a material of the oxide semiconductor, zinc oxide or a material containing zinc oxide as a component is known. Thin film transistors formed using an amorphous oxide (an oxide semiconductor) with an electron carrier concentration of lower than $10^{18}/cm^3$ have been disclosed (see Patent Documents 1 to 3).

Reference
Patent Document
[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

In a transistor which utilizes semiconductor characteristics, it is preferable that variation in threshold voltage caused by time degradation be small and the off-state current be small. For example, when a transistor whose threshold voltage varies greatly owing to time degradation is used for a semiconductor device, the reliability of the semiconductor device is lowered. In addition, when a transistor whose off-state current is large is used for a semiconductor device, the power consumption of the semiconductor device is increased.

It is an object of an embodiment of the present invention to provide a highly reliable semiconductor device. Also, it is an object to provide a method for manufacturing the highly reliable semiconductor device.

In addition, it is an object to provide a semiconductor device with low power consumption. Further, it is an object to provide a method for manufacturing the semiconductor device with low power consumption.

In addition, it is an object to provide a semiconductor device with high productivity. Further, it is an object to provide a method for manufacturing the semiconductor device with high productivity.

In order to achieve the above object, the present inventors etc. focused their attention to the fact that in a semiconductor device in which an oxide semiconductor is used for a semiconductor layer, the concentration of impurities contained in the oxide semiconductor layer and the quantity of oxygen deficiency in the oxide semiconductor layer have an influence on variation in threshold voltage and an increase in off-state current. Examples of the impurities are hydrogen and a substance containing a hydrogen atom such as water.

The impurities contained in the oxide semiconductor can be substantially removed by first heat treatment which is performed after the oxide semiconductor is deposited. However, impurities which are strongly bonded to metal contained in the oxide semiconductor (such as hydrogen and hydroxyl group) are left remaining in the semiconductor layer owing to a strong bonding force. When the oxide semiconductor in which the impurities are left remaining is used for the semiconductor layer, drawbacks such as variation in threshold voltage of the semiconductor device due to use for a long period and light irradiation, an increase in off-state current, and the like are incurred.

In addition, there is a problem in that through a step of removing the impurities, oxygen that is one of main components of the oxide semiconductor is also reduced. Even when only a slight amount of oxygen is removed, an impurity level is formed in the oxide semiconductor, and drawbacks such as variation in threshold voltage, an increase in off-state current, and the like are incurred.

Therefore, in order to achieve the above object, the impurities left remaining in the oxide semiconductor layer may be removed without generating oxygen deficiency, and the oxide semiconductor layer may be purified to have an extremely high purity. Specifically, after oxygen is added to the oxide semiconductor layer, heat treatment for removing impurities may be performed on the oxide semiconductor layer. In particular, in order to add oxygen, it is preferable to use a method in which oxygen having high energy is added by an ion implantation method, an ion doping method, or the like.

By adding oxygen having high energy to the oxide semiconductor by an ion implantation method, an ion doping method, or the like, for example, a bond between hydrogen and metal contained in the oxide semiconductor, a bond between metal and hydroxyl group, or a bond between hydrogen and oxygen in hydroxyl group bonded to metal can be cut. In addition, hydroxyl group or hydrogen eliminated from metal reacts with the oxygen that has been added, so that water is produced. Then, the oxide semiconductor is heated, and water produced by the above reaction may be removed.

A method in which water produced by reaction with added oxygen is removed by heating is easier than a method in which hydrogen or hydroxyl group strongly bonded to metal contained in the oxide semiconductor is directly removed. In addition, since oxygen is added to the oxide semiconductor layer before the heat treatment so that the oxide semiconductor layer contains excessive oxygen, the following problem is alleviated: oxygen that is one of main components of the oxide semiconductor is reduced in heat treatment.

That is, according to an embodiment of the present invention, a method for manufacturing a semiconductor device includes: forming an oxide semiconductor layer, adding oxygen to the oxide semiconductor layer, and performing heat treatment at higher than or equal to 250° C. and lower than or equal to 700° C. on the oxide semiconductor layer to which oxygen is added.

In addition, according to an embodiment of the present invention, a method for manufacturing a semiconductor device includes: forming a gate electrode over a substrate having an insulating surface, forming a gate insulating layer over the gate electrode, forming an oxide semiconductor layer overlapping with the gate electrode so as to be in contact with the gate insulating layer, adding oxygen to the oxide semiconductor layer, performing heat treatment on the oxide semiconductor layer to which oxygen is added, forming a source electrode and a drain electrode whose end portions overlap with the gate electrode so as to be in contact with the oxide semiconductor layer on which the heat treatment is performed, and forming a first insulating layer so as to overlap with a channel formation region of the oxide semiconductor layer and be in contact with a surface of the oxide semiconductor layer.

In addition, according to an embodiment of the present invention, in the method for manufacturing a semiconductor device, a silicon oxide layer is formed by a sputtering method as the first insulating layer which overlaps with the channel formation region of the oxide semiconductor layer and is in contact with the surface of the oxide semiconductor layer.

In addition, according to an embodiment of the present invention, in the method for manufacturing a semiconductor device, a silicon oxide layer and a silicon nitride layer over the silicon oxide layer are formed by a sputtering method as the first insulating layer which overlaps with the channel formation region of the oxide semiconductor layer and is in contact with the surface of the oxide semiconductor layer.

In addition, according to an embodiment of the present invention, a method for manufacturing a semiconductor device includes: forming a source electrode and a drain electrode over a substrate having an insulating surface, forming an oxide semiconductor layer covering an end portion of the source electrode and an end portion of the drain electrode, adding oxygen to the oxide semiconductor layer, performing heat treatment on the oxide semiconductor layer to which oxygen is added, forming a gate insulating layer overlapping with the end portion of the source electrode and the end portion of the drain electrode to be in contact with the oxide semiconductor layer on which the heat treatment is performed, and forming a gate electrode overlapping with the end portion of the source electrode and the end portion of the drain electrode so as to be in contact with the gate insulating layer.

In addition, according to an embodiment of the present invention, in the method for manufacturing a semiconductor device, a silicon oxide layer is formed by a sputtering method as the gate insulating layer in contact with the oxide semiconductor layer.

In addition, according to an embodiment of the present invention, in the method for manufacturing a semiconductor device, a silicon oxide layer and a silicon nitride layer over the silicon oxide layer are formed by a sputtering method as the gate insulating layer in contact with the oxide semiconductor layer.

In addition, according to an embodiment of the present invention, a method for manufacturing a semiconductor device includes: forming, over an insulating film formed over a first transistor, a second transistor by the method for manufacturing a semiconductor device.

In addition, according to an embodiment of the present invention, in the method for manufacturing a semiconductor device, oxygen is added by an ion implantation method or an ion doping method.

In accordance with the method for manufacturing a semiconductor device of the present invention, impurities left remaining in an oxide semiconductor layer can be reduced. In a semiconductor device including the oxide semiconductor layer in which the impurities left remaining are reduced, variation in threshold voltage is suppressed, and the reliability of the semiconductor device is high.

Therefore, in accordance with an embodiment of the present invention, a highly reliable semiconductor device can be provided, and a method for manufacturing the highly reliable semiconductor device can be provided.

In accordance with the method for manufacturing a semiconductor device of the present invention, impurities left remaining in an oxide semiconductor layer can be reduced. In a semiconductor device including the oxide semiconductor layer in which the impurities left remaining are reduced, the off-state current is reduced, and the power consumption of the semiconductor device is low.

Therefore, in accordance with an embodiment of the present invention, a semiconductor device with low power consumption can be provided, and a method for manufacturing the semiconductor device with low power consumption can be provided.

In accordance with the method for manufacturing a semiconductor device of the present invention, impurities left remaining in an oxide semiconductor layer can be reduced. In a semiconductor device including the oxide semiconductor layer in which the impurities left remaining are reduced, variation in semiconductor characteristics is small, and the productivity of the semiconductor device is high.

Therefore, in accordance with an embodiment of the present invention, a semiconductor device with high productivity can be provided, and a method for manufacturing the semiconductor device with high productivity can be provided.

BRIEF DESCRIPTION OF DRAWINGS

FIGS. 10A to 10E are diagrams illustrating a method for manufacturing a sample according to an example.

BEST MODE FOR CARRYING OUT THE INVENTION

Figure 1A:
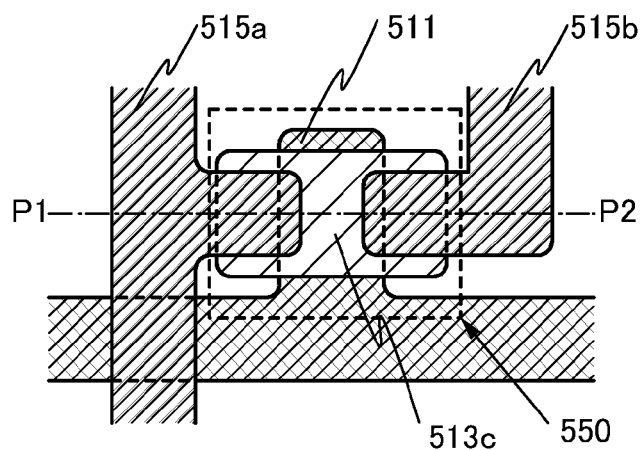
FIGS. 1A and 1B are diagrams illustrating a structure of a semiconductor device according to an embodiment.

Embodiments and Examples will be described in detail with reference to drawings. Note that the present invention is not limited to the following description, and it will be easily understood by those skilled in the art that modes and details thereof can be variously changed without departing from the spirit and the scope of the present invention. Therefore, the present invention should not be construed as being limited to the description in the following embodiments and examples. Note that in the structures of the invention described below, the same portions or portions having similar functions are denoted by the same reference numerals throughout the drawings, and description of such portions is not repeated.

(Embodiment 1)

In this embodiment, a method for manufacturing a bottom-gate transistor will be described with reference to FIGS. 1A and 1B and FIGS. 2A to 2E. In the method, after oxygen is added to an oxide semiconductor layer, heat treatment is performed on the oxide semiconductor layer so as to remove impurities and highly purify the oxide semiconductor layer.

Figure 1B:
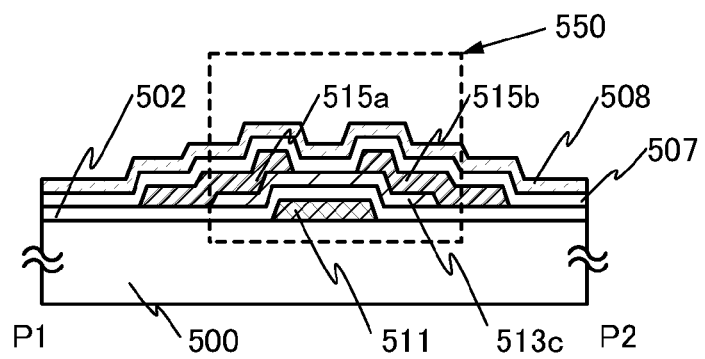

FIGS. 1A and 1B illustrate a structure of a transistor 550 that is bottom-gate type manufactured in this embodiment. FIG. 1A is a top view of the transistor 550 and FIG. 1B is a cross-sectional view of the transistor 550. FIG. 1B illustrates a cross section along line P1-P2 in FIG. 1A.

In the transistor 550, a gate electrode 511 and a gate insulating layer 502 which covers the gate electrode 511 are provided over a substrate 500 having an insulating surface. An oxide semiconductor layer 513c which is highly purified and overlaps with the gate electrode 511 is provided over the gate insulating layer 502. In addition, a first electrode 515a and a second electrode 515b which are in contact with the oxide semiconductor layer 513c, serve as a source electrode and a drain electrode, and have end portions overlapping with the gate electrode 511 are provided. Further, an insulating layer 507 which is in contact with and overlaps with a channel formation region of the oxide semiconductor layer 513c, and a protective insulating layer 508 which covers the transistor 550 are provided.

Next, a method for manufacturing the transistor 550 over the substrate 500 will be described with reference to FIGS. 2A to 2E.

First, after a conductive film is formed over the substrate 500 having an insulating surface, a wiring layer including the gate electrode 511 is formed by a first photolithography step. Note that a resist mask may be formed by an inkjet method. Formation of the resist mask by an inkjet method needs no photomask; thus, manufacturing cost can be reduced.

In this embodiment, as the substrate 500 having an insulating surface, a glass substrate is used.

An insulating film serving as a base film may be provided between the substrate 500 and the gate electrode 511. The base film has a function of preventing diffusion of impurity elements (e.g., an alkali metal such as Li or Na, an alkaline earth metal such as Ca, and the like) from the substrate 500, and can be formed to have a single layer or stack structure using one or more of a silicon nitride film, a silicon oxide film, a silicon nitride oxide film, a silicon oxynitride film, and the like.

Further, the gate electrode 511 can be formed with a single layer or a stack structure using a metal material such as molybdenum, titanium, chromium, tantalum, tungsten, neodymium, or scandium, or an alloy material containing any of these materials as a main component. Note that aluminum or copper can be used as the above metal material if aluminum or copper can withstand the temperature of heat treatment performed in a later step. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used. In the case of using copper, a structure in which a Cu—Mg—Al alloy is provided over the layer serving as a base and copper is provided thereover is preferable. The provision of the Cu—Mg—Al alloy has an effect in enhancing adhesiveness between copper and the base such as an oxide film.

Next, the gate insulating layer 502 is formed over the gate electrode 511. The gate insulating layer 502 can be formed by a CVD method, a sputtering method, or the like. In addition, the gate insulating layer 502 can be formed with a single layer or a stack structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, a tantalum oxide layer, a gallium oxide layer, and the like.

As an oxide semiconductor in this embodiment, an oxide semiconductor which is made to be i-type or substantially i-type by removing impurities (a highly purified oxide semiconductor) is used. Such a highly purified oxide semiconductor is highly sensitive to an interface state and interface electric charge; thus, an interface between the oxide semiconductor layer and the gate insulating layer is important. For that reason, the gate insulating layer that is to be in contact with the highly purified oxide semiconductor needs to have high quality.

For example, a high-density plasma CVD method using microwaves (e.g., with a frequency of 2.45 GHz) is preferably adopted because an insulating layer that is formed can be dense and have high withstand voltage and high quality. When the highly purified oxide semiconductor and the high-quality gate insulating layer are in close contact with each other, the interface state density can be reduced to obtain favorable interface characteristics.

Needless to say, another film formation method such as a sputtering method or a plasma CVD method can be employed as long as the method enables formation of a good-quality insulating layer as the gate insulating layer. Further, an insulating layer whose film quality as the gate insulating layer and characteristic of the interface with the oxide semiconductor are improved by heat treatment which is performed after formation of the insulating layer may be used. In any case, any insulating layer may be used as long as the insulating layer can reduce interface state density with the oxide semiconductor and form a favorable interface as well as having good film quality as the gate insulating layer.

Note that the gate insulating layer 502 is in contact with an oxide semiconductor film which is formed later. When hydrogen is contained in the oxide semiconductor film, characteristics of the transistor are adversely affected; therefore, it is preferable that the gate insulating layer 502 do not contain hydrogen, hydroxyl group, and moisture. In order that the gate insulating layer 502 and the oxide semiconductor film contain as little hydrogen, hydroxyl group, and moisture as possible, it is preferable that impurities adsorbed on the substrate 500, such as hydrogen or moisture, be eliminated and removed by preheating the substrate 500 over which layers up to and including the gate electrode 511 are formed or the substrate 500 over which layers up to and including the gate insulating layer 502 are formed in a preheating chamber of a sputtering apparatus, as pretreatment for formation of the oxide semiconductor film. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that this preheating treatment can be omitted. This preheating may be similarly performed on the substrate 500 over which layers up to and including the first electrode 515a and the second electrode 515b are formed before formation of the insulating layer 507.

Next, over the gate insulating layer 502, the oxide semiconductor film having a thickness of greater than or equal to 2 nm and less than or equal to 200 nm, preferably greater than or equal to 5 nm and less than or equal to 30 nm is formed. The oxide semiconductor film is formed by a sputtering method using an oxide semiconductor as a target. Moreover, the oxide semiconductor film can be formed by a sputtering method in a rare gas (for example, argon) atmosphere, an oxygen atmosphere, or a mixed atmosphere containing a rare gas (for example, argon) and oxygen.

Note that before the oxide semiconductor film is formed by a sputtering method, powdery substances (also referred to as particles or dusts) which are attached on a surface of the gate insulating layer 502 are preferably removed by reverse sputtering in which an argon gas is introduced and plasma is generated. The reverse sputtering refers to a method in which an RF power source is used for application of voltage to a substrate side in an argon atmosphere and plasma is generated around the substrate to modify a surface. Note that instead of an argon atmosphere, a nitrogen atmosphere, a helium atmosphere, an oxygen atmosphere, or the like may be used.

As the oxide semiconductor used for the oxide semiconductor film, the following oxide semiconductors can be used: a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, an In—O-based oxide semiconductor, a Sn—O-based oxide semiconductor, a Zn—O-based oxide semiconductor, and the like. In addition, silicon oxide may be contained in the oxide semiconductor film. Addition of silicon oxide ($SiO_x$ (x>0)) which hinders crystallization into the oxide semiconductor film can suppress crystallization of the oxide semiconductor film at the time when heat treatment is performed after formation of the oxide semiconductor film in the manufacturing process. The oxide semiconductor film is preferably in an amorphous state; however, the oxide semiconductor film may be partly crystallized. In this specification, for example, an In—Ga—Zn—O-based oxide semiconductor means an oxide film containing indium (In), gallium (Ga), and zinc (Zn), and there is no particular limitation on the composition ratio. In addition, the oxide semiconductor film may contain an element other than In, Ga, and Zn, and a thin film of a material represented by the chemical formula, $InMO_3(ZnO)_m$ (m>0, m is not a natural number) can be used. Here, M represents one or more metal elements selected from Ga, Al, Mn, and Co. For example, M can be Ga, Ga and Al, Ga and Mn, Ga and Co, or the like. The oxide semiconductor preferably contains In, more preferably contains In and Ga. In order to obtain an i-type (intrinsic) oxide semiconductor layer, dehydration or dehydrogenation is effective. In this embodiment, the oxide semiconductor film is formed using an In—Ga—Zn—O-based oxide target by a sputtering method.

As a target for forming the oxide semiconductor film by a sputtering method, for example, an oxide target having a composition ratio of $In_2O_3$:$Ga_2O_3$:ZnO=1:1:1 [molar ratio] is used, and an In—Ga—Zn—O film is formed. Without limitation to the material and the composition of the above target, for example, an oxide target having a composition ratio of $In_2O_3$:$Ga_2O_3$:ZnO=1:1:2 [molar ratio] or $In_2O_3$:$Ga_2O_3$:ZnO=1:1:4 [molar ratio] may be used.

In the case where an In—Zn—O-based material is used for the oxide semiconductor film, the composition ratio of a target used is In:Zn=50:1 to 1:2 in an atomic ratio ($In_2O_3$:ZnO=25:1 to 1:4 in a molar ratio), preferably In:Zn=1:1 to 1:20 in an atomic ratio ($In_2O_3$:ZnO=2:1 to 10:1 in a molar ratio), more preferably In:Zn=1.5:1 to 15:1 in an atomic ratio ($In_2O_3$:ZnO=3:4 to 15:2 in a molar ratio). For example, a target used for the formation of an In—Zn—O-based oxide semiconductor has an atomic ratio of In: Zn:O=1:1:X, where X>1, preferably X>1.5.

In addition, the filling rate of the oxide target is higher than or equal to 90% and lower than or equal to 100%, preferably higher than or equal to 95% and lower than or equal to 99.9%. With the use of the oxide target with a high filling rate, a dense oxide semiconductor film can be formed. Moreover, the purity of the target is preferably higher than or equal to 99.99%, where it is preferable that impurities, for example, an alkali metal such as Li or Na and an alkaline earth metal such as Ca, be particularly reduced.

A high-purity gas from which impurities such as hydrogen, water, hydroxyl group, or hydride are removed is used as a sputtering gas used for forming the oxide semiconductor film. For example, it is preferable that a high-purity gas from which impurities are removed to a concentration of about lower than or equal to 10 ppm, preferably lower than or equal to 1 ppm be used. Specifically, a high-purity gas in which the dew point is lower than or equal to −60° C. is preferable.

The substrate is placed in a deposition chamber under reduced pressure, and the substrate temperature is set to higher than or equal to 100° C. and lower than or equal to 600° C., preferably higher than or equal to 200° C. and lower than or equal to 400° C. By forming the oxide semiconductor film in a state where the substrate is heated, the concentration of impurities contained in the formed oxide semiconductor film can be reduced. In addition, damage by sputtering can be reduced. Then, a sputtering gas from which hydrogen and moisture are removed is introduced while residual moisture in the deposition chamber and hydrogen and moisture which enter from the outside into the deposition chamber (hydrogen and moisture which enter due to leakage) are removed with the use of an evacuation pump, and the oxide semiconductor film is formed over the substrate 500 using the above target. In order to remove the residual moisture from the deposition chamber, an entrapment vacuum pump, for example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities in the oxide semiconductor film formed in the deposition chamber can be reduced.

The atmosphere for a sputtering method may be a rare gas (typically argon) atmosphere, an oxygen atmosphere, or a mixed atmosphere containing a rare gas and oxygen.

As one example of the deposition conditions, the distance between the substrate and the target is 100 mm, the pressure is 0.6 Pa, the electric power of a direct-current (DC) power source is 0.5 kW, and the atmosphere is an oxygen atmosphere (the proportion of the oxygen flow is 100%). Note that a pulse direct current power source is preferable because powder substances (also referred to as particles or dusts) generated in deposition can be reduced and the film thickness can be uniform. Moreover, when the leakage rate of the treatment chamber of the sputtering apparatus is set to lower than or equal to $1 \times 10^{-10}$ Pa·m$^3$/second, entry of impurities such as an alkali metal or hydride into the oxide semiconductor film that is being formed by a sputtering method can be reduced. Further, with the use of an entrapment vacuum pump as an evacuation system, counter flow of impurities such as an alkali metal, a hydrogen atom, a hydrogen molecule, water, hydroxyl group, or hydride from the evacuation system can be reduced. Note that impurities, for example, an alkali metal such as Li or Na and an alkaline earth metal such as Ca contained in the oxide semiconductor layer are preferably reduced. Specifically, the impurity concentrations of Li, Na, and K contained in the oxide semiconductor layer are each lower than or equal to $5 \times 10^{15}$ cm$^{-3}$, preferably lower than or equal to $1 \times 10^{15}$ cm$^{-3}$ when the concentrations are measured with the use of SIMS. An alkali metal and an alkaline earth metal are adverse impurities for the oxide semiconductor and are contained as little as possible. An alkali metal, in particular, Na diffuses into an oxide and becomes Na$^+$ when an insulating film in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5 \times 10^{19}$ cm$^{-3}$, particularly lower than or equal to $5 \times 10^{18}$ cm$^3$.

Next, the oxide semiconductor film is processed into an island-shaped oxide semiconductor layer 513a by a second photolithography step. A resist mask for forming the island-shaped oxide semiconductor layer may be formed by an inkjet method. Formation of the resist mask by an inkjet method needs no photomask; thus, manufacturing cost can be reduced.

In addition, in the case where a contact hole is formed in the gate insulating layer 502, a step of forming the contact hole can be performed at the same time as processing of the oxide semiconductor film.

Figure 2A:
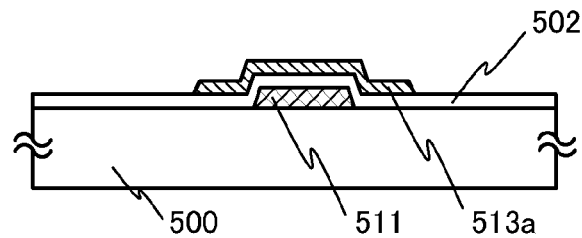
FIGS. 2A to 2E are diagrams illustrating a method for manufacturing a semiconductor device according to an embodiment.

Note that the etching of the oxide semiconductor film here may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may be used. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferable. Also, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used. As a dry etching method, a parallel-plate reactive ion etching (RIE) method or an inductively coupled plasma (ICP) etching method can be used. Etching conditions (the amount of electric power applied to a coil-shaped electrode, the amount of electric power applied to an electrode on a substrate side, the electrode temperature on the substrate side, and the like) are appropriately adjusted so that the oxide semiconductor film can be etched into a desired shape. Note that the cross-sectional view at this stage is illustrated in FIG. 2A.

Next, oxygen is added to the oxide semiconductor layer 513a. By an ion implantation method, an ion doping method, or the like, oxygen having high energy is added.

In an ion implantation method, a source gas is made into plasma, ion species included in this plasma are extracted and mass-separated, ion species having predetermined mass are accelerated, and an object to be processed is irradiated with the accelerated ion species in the form of an ion beam. In an ion doping method, a source gas is made into plasma, ion species are extracted from this plasma by an operation of a predetermined electric field, the extracted ion species are accelerated without mass separation, and an object to be processed is irradiated with the accelerated ion species in the form of an ion beam. When the addition of oxygen is performed using an ion implantation method involving mass separation, an impurity such as a metal element can be prevented from being added, together with oxygen, to the oxide semiconductor film. On the other hand, an ion doping method enables ion-beam irradiation to a larger area than an ion implantation method, and therefore, when the addition of oxygen is performed using an ion doping method, the takt time can be shortened.

In the case where an oxygen gas is used and oxygen is added by an ion implantation method, the acceleration voltage may be set to higher than or equal to 5 keV and lower than or equal to 100 keV, and the implantation amount of oxygen ions may be set to greater than or equal to $1 \times 10^{14}$ [ions/cm$^2$] and less than or equal to $5 \times 10^{17}$ [ions/cm$^2$].

Figure 2B:
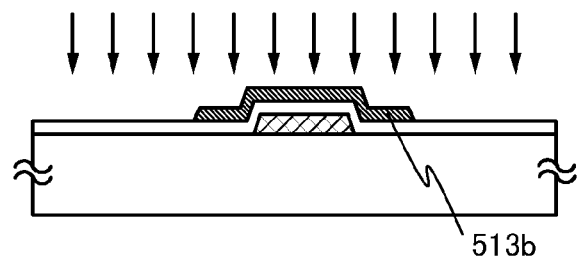
Figure 2C:
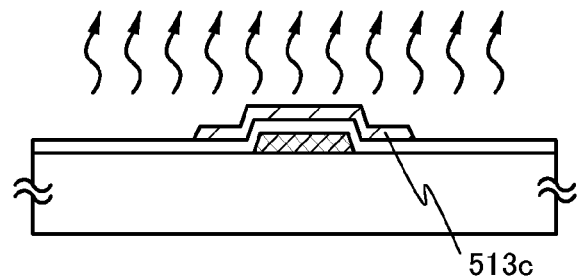

By adding oxygen having high energy to the oxide semiconductor by an ion implantation method, an ion doping method, or the like, for example, a bond between hydrogen and metal contained in the oxide semiconductor, a bond between metal and hydroxyl group, or a bond between hydrogen and oxygen in hydroxyl group bonded to metal can be cut. The oxide semiconductor layer 513a is changed into an oxide semiconductor layer 513b which contains impurities eliminated from the metal. FIG. 2B illustrates a cross-sectional view at this stage.

Then, the oxide semiconductor layer 513b which contains the impurities eliminated from the metal is subjected to first heat treatment. Through this first heat treatment, the impurities eliminated from the metal can be removed from the oxide semiconductor layer. For example, water produced by reaction of added oxygen with hydrogen or hydroxyl group eliminated from the metal can be removed. The method in which produced water is removed by heating is easier than a method in which hydrogen or hydroxyl group strongly bonded to the metal is directly removed.

The first heat treatment is performed at higher than or equal to 250° C. and lower than or equal to 700° C., preferably higher than or equal to 450° C. and lower than or equal to 650° C., or higher than or equal to 450° C. and lower than the strain point of the substrate. For example, the first heat treatment may be performed at 500° C. for longer than or equal to three minutes and shorter than or equal to six minutes. By using a rapid thermal annealing (RTA) method for the heat treatment, dehydration or dehydrogenation can be performed in a short time; therefore, the treatment can be performed even at a temperature of higher than the strain point of a glass substrate. Whereas substrates which are as large as about the fourth-generation glass substrate can be subjected to heat treatment at a temperature of higher than or equal to 250° C. and lower than or equal to 750° C., substrates which are as large as about the sixth-generation glass substrate to the tenth-generation glass substrate are preferably subjected to heat treatment at a temperature of higher than or equal to 250° C. and lower than or equal to 450° C. Here, the substrate is put in an electric furnace which is one of heat treatment apparatuses, heat treatment is performed on the oxide semiconductor layer for 1 hour at 600° C. in a nitrogen atmosphere, and then, slow cooling is performed on the oxide semiconductor layer to a temperature of lower than or equal to 200° C. without exposure to the air so that entry of water and hydrogen into the oxide semiconductor layer is prevented. Thus, an oxide semiconductor layer 513c is obtained (see FIG. 2C). When the oxide semiconductor layer is cooled to lower than or equal to 200° C., the high-temperature oxide semiconductor layer can be prevented from being in contact with water or moisture in the air. When the high-temperature oxide semiconductor layer is in contact with water or moisture in the air, in some cases, the oxide semiconductor is contaminated with an impurity containing a hydrogen atom.

The heat treatment apparatus is not limited to an electric furnace, and an apparatus for heating an object to be processed by heat radiation or heat conduction from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA in which the substrate is put into an inert gas heated to a high temperature of 650° C. to 700° C., heated for several minutes, and taken out of the inert gas heated to the high temperature may be performed.

Note that in the first heat treatment, it is preferable that water, hydrogen, and the like be not contained in nitrogen or a rare gas such as helium, neon, or argon. It is preferable that the purity of nitrogen or a rare gas such as helium, neon, or argon which is introduced into the heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

In addition, after the oxide semiconductor layer is heated by the first heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the case where measurement is performed with the use of a dew point meter of a cavity ring down laser spectroscopy (CRDS) system) may be introduced into the same furnace. It is preferable that the oxygen gas or the $N_2O$ gas do not contain water, hydrogen, and the like. Alternatively, the purity of the oxygen gas or the $N_2O$ gas which is introduced into the heat treatment apparatus is higher than or equal to 6 N, preferably higher than or equal to 7 N (i.e., the impurity concentration of the oxygen gas or the $N_2O$ gas is lower than or equal to 1 ppm, preferably lower than or equal to 0.1 ppm). By the effect of the oxygen gas or the $N_2O$ gas, oxygen which is a main component of the oxide semiconductor and which has been reduced at the same time as the step for removing impurities by dehydration or dehydrogenation is supplied, so that the oxide semiconductor layer can be a high-purity and electrically i-type (intrinsic) oxide semiconductor layer.

In addition, the first heat treatment can be performed on the oxide semiconductor film before being processed into the island-shaped oxide semiconductor layer as long as it is performed after oxygen is added. In that case, the substrate is taken out of the heat treatment apparatus after the first heat treatment, and then a photolithography step is performed.

Note that the first heat treatment may be performed at any of the following timings in addition to the above timing as long as after formation of the oxide semiconductor layer: after the source electrode and the drain electrode are formed over the oxide semiconductor layer, and after the insulating layer is formed over the source electrode and the drain electrode.

Further, in the case of forming the contact hole in the gate insulating layer 502, the step may be performed either before or after the first heat treatment is performed on the oxide semiconductor film. Through the above-described steps, the concentration of hydrogen in the island-shaped oxide semiconductor layer can be reduced and the island-shaped oxide semiconductor layer can be highly purified. Thus, the oxide semiconductor layer can be stabilized. In addition, heat treatment at a temperature of lower than or equal to the strain point of a glass substrate makes it possible to form an oxide semiconductor film with a wide band gap in which carrier density is extremely low. Therefore, the transistor can be manufactured using a large-sized substrate, so that the productivity can be increased. In addition, by using the oxide semiconductor film in which the hydrogen concentration is reduced and the purity is improved, it is possible to manufacture a transistor with high withstand voltage and an extremely small off-state current. The above heat treatment can be performed at any time as long as it is performed after the oxide semiconductor layer is formed. Note that in the case where the oxide semiconductor film is heated, although depending on a material of the oxide semiconductor film or heating conditions, plate-shaped crystals are formed at the surface of the oxide semiconductor film in some cases. The plate-shaped crystals are preferably c-axis aligned in a direction substantially perpendicular to the surface of the oxide semiconductor film.

In addition, as the oxide semiconductor film, an oxide semiconductor film having crystal regions with a large thickness, that is, crystal regions that are c-axis aligned perpendicularly to the surface of the film may be formed by performing film formation by two steps and heat treatment by two steps, which can be formed regardless of a material of a base component with which the oxide semiconductor film formed first is in contact, such as an oxide, a nitride, a metal, or the like. For example, a first oxide semiconductor film with a thickness of greater than or equal to 3 nm and less than or equal to 15 nm is formed, first addition of oxygen is performed, and first heat treatment for crystallization is performed in a nitrogen, oxygen, rare gas, or dry air atmosphere at a temperature of higher than or equal to 450° C. and lower than or equal to 850° C., preferably higher than or equal to 550° C. and lower than or equal to 750° C., so that a first oxide semiconductor film having a crystal region (including a plate-shaped crystal) in a region including a surface is formed. Then, a second oxide semiconductor film which has a larger thickness than the first oxide semiconductor film is formed, second addition of oxygen is performed, and second heat treatment for crystallization is performed at a temperature of higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth and the whole second oxide semiconductor film is crystallized. In such a manner, the oxide semiconductor layer having a crystal region with a large thickness may be formed. Moreover, an oxide semiconductor film having crystal regions which are c-axis aligned perpendicularly to the surface of the film may be formed by performing film formation while the substrate is heated to a temperature at which the oxide semiconductor is c-axis aligned when the oxide semiconductor film is formed. With such a film formation method, the process can be shortened. The temperature for heating the substrate may be set as appropriate in accordance with other film formation conditions which differ depending on a film formation apparatus; for example, when the film formation is performed with a sputtering apparatus, the substrate temperature may be set to a temperature of higher than or equal to 250° C.

Next, a conductive film for forming the first and second electrodes (including a wiring formed in the same layer as the first and second electrodes) is formed over the gate insulating layer 502 and the oxide semiconductor layer 513c. For the conductive film for forming the first and second electrodes, for example, a metal film containing an element selected from Al, Cr, Cu, Ta, Ti, Mo, and W, an alloy film containing any of these elements as a component, a metal nitride film thereof (such as a titanium nitride film, a molybdenum nitride film, or a tungsten nitride film), or the like can be used. In addition, in order to solve a heat resistance problem and a corrosive problem, a structure in which a film of a metal such as Al or Cu has, on one of or on both the bottom side and the top side, a film of refractory metal such as Ti, Mo, W, Cr, Ta, Nd, Sc, or Y, or a metal nitride film thereof (such as a titanium nitride film, a molybdenum nitride film, or a tungsten nitride film) may be used. The conductive film may have a single-layer structure or a stack structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. Alternatively, the conductive film may be formed using conductive metal oxide. As the conductive metal oxide, indium oxide, tin oxide, zinc oxide, an alloy of indium oxide and tin oxide, an alloy of indium oxide and zinc oxide, or the conductive metal oxide material containing silicon or silicon oxide can be used. Note that in the case where heat treatment is performed after the conductive film is formed, the conductive film preferably has heat resistance high enough to withstand the heat treatment.

Figure 2D:
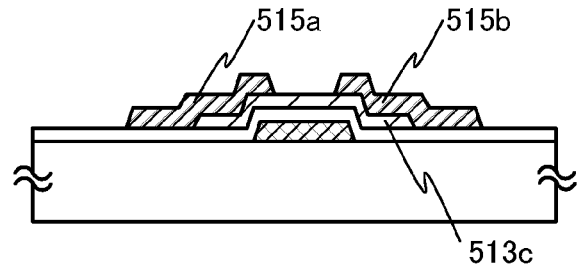
Figure 2E:
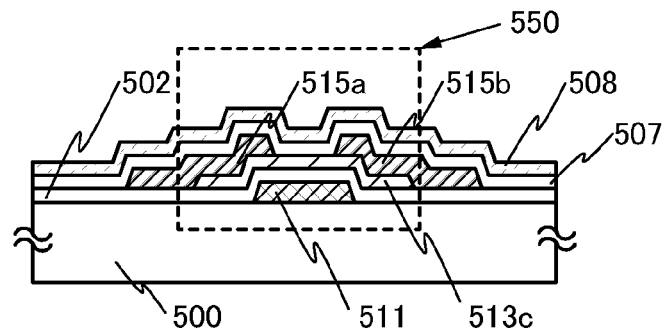

A resist mask is formed over the conductive film through a third photolithography step, and the first electrode 515a and the second electrode 515b serving as a source electrode and a drain electrode are formed by selective etching; then, the resist mask is removed (see FIG. 2D).

Light exposure at the time of the formation of the resist mask in the third photolithography step may be performed using ultraviolet light, KrF laser light, or ArF laser light. A channel length L of the transistor to be formed later depends on the distance between a lower end of the first electrode and a lower end of the second electrode which are adjacent to each other over the oxide semiconductor layer 513c. When light exposure is performed in the case of a channel length L of shorter than 25 nm, the light exposure at the time of the formation of the resist mask in the third photolithography step may be performed using extreme ultraviolet light having an extremely short wavelength of several nanometers to several tens of nanometers. In the light exposure with the use of extreme ultraviolet light, the resolution is high and the focus depth is large. For these reasons, the channel length L of the transistor to be formed later can be longer than or equal to 10 nm and shorter than or equal to 1000 nm, and the circuit can operate at higher speed.

In order to reduce the number of photomasks and the number of steps in photolithography, an etching step may be performed with the use of a resist mask formed with a multi-tone mask which is a light-exposure mask through which light is transmitted to have a plurality of intensities. A resist mask formed with a multi-tone mask has a shape with a plurality of thicknesses and further can be changed in shape by etching; therefore, the resist mask can be used in a plurality of etching steps for processing into different patterns. A resist mask corresponding to at least two kinds of patterns can be formed by using one multi-tone mask. Thus, the number of light-exposure masks can be reduced and the number of corresponding photolithography steps can also be reduced, whereby simplification of the process can be realized.

Note that it is preferable that etching conditions be optimized so as not to etch and divide the oxide semiconductor layer 513c when the conductive film is etched. However, it is difficult to obtain etching conditions in which only the conductive film is etched and the oxide semiconductor layer 513c is not etched at all. In some cases, only part of the oxide semiconductor layer 513c is etched when the conductive film is etched, whereby the oxide semiconductor layer 513c has a groove portion (a recessed portion).

In this embodiment, a Ti film is used as the conductive film and an In—Ga—Zn—O-based oxide semiconductor is used as the oxide semiconductor layer 513c. In such a combination, ammonia hydrogen peroxide (a mixed solution of ammonia, water, and hydrogen peroxide) is preferably used as an etchant. By use of ammonia hydrogen peroxide as an etchant, the conductive film can be selectively etched.

Next, by plasma treatment using a gas such as $N_2O$, $N_2$, or Ar, water or the like adsorbed to a surface of an exposed portion of the oxide semiconductor layer may be removed. Plasma treatment may be performed using a mixture gas of oxygen and argon. The plasma treatment is performed, and after that, the insulating layer 507 which serves as a protective insulating film in contact with part of the oxide semiconductor layer is formed without exposure to the air.

The insulating layer 507 preferably contains impurities such as moisture or hydrogen as little as possible, and may be formed using an insulating film of a single layer or a plurality of insulating films stacked. In addition, the insulating layer 507 can be formed to a thickness of at least 1 nm by a method by which an impurity such as water or hydrogen does not enter the insulating layer 507, such as a sputtering method as appropriate. When hydrogen is contained in the insulating layer 507, entry of the hydrogen into the oxide semiconductor layer or extraction of oxygen from the oxide semiconductor layer by the hydrogen is caused, thereby causing the back-channel of the oxide semiconductor layer to have lower resistance (to have n-type conductivity), so that a parasitic channel might be formed. Therefore, it is important that a formation method in which hydrogen is not used is employed so that the insulating layer 507 containing as little hydrogen as possible is formed. For example, an insulating film having a structure in which an aluminum oxide film with a thickness of 100 nm formed by a sputtering method is stacked over a gallium oxide film with a thickness of 200 nm formed by a sputtering method may be formed. The substrate temperature during the film formation may be higher than or equal to room temperature and lower than or equal to 300° C. Further, the insulating film preferably contains much oxygen that exceeds the stoichiometric proportion, more preferably contains oxygen more than 1 time and less than two times the stoichiometric proportion. When the insulating film thus contains excessive oxygen, oxygen is supplied to the interface with the island-shaped oxide semiconductor film; thus, oxygen deficiency can be reduced.

In this embodiment, a silicon oxide film is formed to a thickness of 200 nm as the insulating layer 507 by a sputtering method. The substrate temperature in film formation may be higher than or equal to room temperature and lower than or equal to 300° C. and is 100° C. in this embodiment. The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target can be used. For example, the silicon oxide film can be formed by a sputtering method with the use of a silicon target in an atmosphere containing oxygen. As the insulating layer 507 which is formed in contact with the oxide semiconductor layer, an inorganic insulating film which does not contain impurities such as moisture, a hydrogen ion, or $OH^-$ and blocks entry of these from the outside is used. Typically, a silicon oxide film, a silicon oxynitride film, an aluminum oxide film, an aluminum oxynitride film, or the like is used.

In order to remove residual moisture from the deposition chamber of the insulating layer 507 in a manner similar to the deposition of the oxide semiconductor film, an entrapment vacuum pump (such as a cryopump) is preferably used. When the insulating layer 507 is formed in the deposition chamber evacuated using a cryopump, the impurity concentration in the insulating layer 507 can be reduced. In addition, as an evacuation unit for removing the residual moisture from the deposition chamber of the insulating layer 507, a turbo pump provided with a cold trap may be used.

Further, a high-purity gas from which impurities such as hydrogen, water, hydroxyl group, or hydride are removed is preferably used as a sputtering gas used in formation of the insulating layer 507.

Note that after the insulating layer 507 is formed, second heat treatment (third heat treatment in the case where film formation and heat treatment of the oxide semiconductor layer are each performed by two steps) may be performed. The heat treatment is performed in an atmosphere of nitrogen, ultra-dry air, or a rare gas (argon, helium, or the like) preferably at a temperature of higher than or equal to 200° C. and lower than or equal to 400° C., for example, higher than or equal to 250° C. and lower than or equal to 350° C. It is preferable that the content of water in the gas be less than or equal to 20 ppm, more preferably less than or equal to 1 ppm, still more preferably less than or equal to 10 ppb. Alternatively, RTA treatment may be performed at high temperature for a short time as in the first heat treatment. Even when oxygen deficiency is generated in the island-shaped oxide semiconductor layer by the first heat treatment, by performing heat treatment after the insulating layer 507 containing oxygen is provided, oxygen is supplied to the island-shaped oxide semiconductor layer from the insulating layer 507. By supplying oxygen to the island-shaped oxide semiconductor layer, oxygen deficiency that serves as a donor is reduced in the island-shaped oxide semiconductor layer and the stoichiometric proportion can be satisfied. As a result, the island-shaped oxide semiconductor layer can be made to be substantially i-type and variation in electric characteristics of the transistor due to oxygen deficiency can be reduced, which results in improvement in electric characteristics. The timing of this second heat treatment is not particularly limited as long as it is after the formation of the insulating layer 507, and this second heat treatment can be performed without increasing the number of steps by doubling as another step such as heat treatment in formation of a resin film or heat treatment for reduction of the resistance of a light-transmitting conductive film, and thereby the island-shaped oxide semiconductor layer can be made to be substantially i-type. Moreover, the oxygen deficiency that serves as a donor in the island-shaped oxide semiconductor layer may be reduced by subjecting the island-shaped oxide semiconductor layer to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in the oxygen atmosphere do not contain water, hydrogen, or the like. Alternatively, the purity of the oxygen gas which is introduced into the heat treatment apparatus is higher than or equal to 6N (99.9999%), preferably higher than or equal to 7N (99.99999%) (that is, the impurity concentration in the oxygen is lower than or equal to 1 ppm, preferably lower than or equal to 0.1 ppm). In this embodiment, the second heat treatment (at a temperature of higher than or equal to 200° C. and lower than or equal to 400° C., for example, higher than or equal to 250° C. and lower than or equal to 350° C.) is performed in an inert gas atmosphere or an oxygen gas atmosphere. For example, the second heat treatment is performed at 250° C. in a nitrogen atmosphere for 1 hour. In the second heat treatment, heat is applied while part of the oxide semiconductor layer (the channel formation region) is in contact with the insulating layer 507. The second heat treatment has the following effect. By the above first heat treatment, in some cases, whereas an impurity such as hydrogen, moisture, hydroxyl group, or hydride (also referred to as a hydrogen compound) is intentionally removed from the oxide semiconductor layer, oxygen which is one of main components of the oxide semiconductor is reduced; since with the second heat treatment, oxygen is supplied to the oxide semiconductor layer subjected to the first heat treatment, the oxide semiconductor layer is highly purified to be electrically i-type (intrinsic).

As described above, oxygen is added to the oxide semiconductor film and the first heat treatment is performed after oxygen is added to the oxide semiconductor film, whereby impurities such as hydrogen, moisture, hydroxyl group, or hydride (also referred to as a hydrogen compound) can be intentionally removed from the oxide semiconductor layer. In addition, since oxygen is added to the oxide semiconductor layer before the heat treatment so that the oxygen semiconductor layer contains excessive oxygen, the following problem is alleviated: oxygen that is one of main components of the oxide semiconductor is reduced in heat treatment. Accordingly, the oxide semiconductor layer is highly purified to be an electrically i-type (intrinsic) or substantially i-type semiconductor. Through the above process, the transistor 550 is formed.

When a silicon oxide layer having a lot of defects is used as the insulating layer 507, with the heat treatment which is performed after the formation of the silicon oxide layer, impurities such as hydrogen, moisture, hydroxyl group, or hydride contained in the oxide semiconductor layer can be diffused into the silicon oxide layer so that the impurities in the oxide semiconductor layer can be further reduced. In addition, when a silicon oxide layer containing excessive oxygen is used as the insulating layer 507, heat treatment which is performed after the formation of the insulating layer 507 has an effect in moving oxygen in the insulating layer 507 to the oxide semiconductor layer 513c, and improving the oxygen concentration in the oxide semiconductor layer 513c and highly purifying the oxide semiconductor layer 513c.

The protective insulating layer 508 may be formed over the insulating layer 507. As the protective insulating layer 506, for example, a silicon nitride film is formed by an RF sputtering method. Since an RF sputtering method has high productivity, it is preferably used as a film formation method of the protective insulating layer. As the protective insulating layer, an inorganic insulating film which does not contain an impurity such as moisture and blocks entry of the impurity from the outside, such as a silicon nitride film or an aluminum nitride film, is used. In this embodiment, the protective insulating layer 508 is formed using a silicon nitride film (see FIG. 2E).

In this embodiment, as the protective insulating layer 508, a silicon nitride film is formed by heating the substrate 500 over which layers up to and including the insulating layer 507 are formed, to a temperature of 100° C. to 400° C., introducing a sputtering gas containing high-purity nitrogen from which hydrogen and moisture are removed, and using a target of a silicon semiconductor. Also in this case, it is preferable that the protective insulating layer 508 be formed while residual moisture in the treatment chamber is removed, in a manner similar to that of the insulating layer 507.

After the formation of the protective insulating layer, heat treatment may be further performed at higher than or equal to 100° C. and lower than or equal to 200° C. in the air for longer than or equal to 1 hour and shorter than or equal to 30 hours. This heat treatment may be performed at a fixed heating temperature. Alternatively, the following change in the heating temperature may be conducted plural times repeatedly: the heating temperature is increased from a room temperature to a temperature of higher than or equal to 100° C. and lower than or equal to 200° C. and then decreased to a room temperature.

In the transistor including the highly purified oxide semiconductor layer which is formed according to this embodiment, variation in threshold voltage is small. Therefore, by employing the method for manufacturing a semiconductor device described in this embodiment, a highly reliable semiconductor device can be provided. In addition, a semiconductor device with high productivity can be provided.

In addition, since the off-state current can be reduced, a semiconductor device with low power consumption can be provided.

In addition, since the transistor including the highly purified oxide semiconductor layer has high field-effect mobility, high-speed operation is possible. When the transistor including the highly purified oxide semiconductor layer is used in a pixel portion in a liquid crystal display device, a high-quality image can be provided. In addition, by using the transistor including the highly purified oxide semiconductor layer, a driver circuit portion and a pixel portion can be formed over one substrate; thus, the number of components of the liquid crystal display device can be reduced.

This embodiment can be combined with any of other embodiments in this specification as appropriate.

(Embodiment 2)

In this embodiment, a method for manufacturing a top-gate transistor will be described with reference to FIGS. 3A and 3B and FIGS. 4A to 4E. In the method, a method in which an oxide semiconductor layer is highly purified by performing heat treatment on the oxide semiconductor layer after addition of oxygen to remove impurities is used.

Figure 3A:
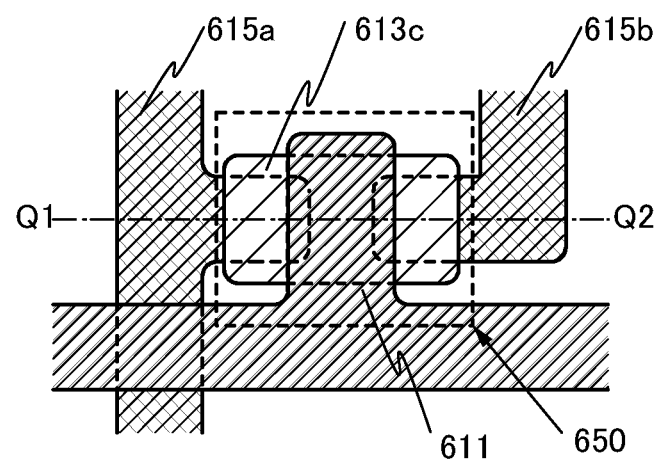
FIGS. 3A and 3B are diagrams illustrating a structure of a semiconductor device according to an embodiment.
Figure 3B:
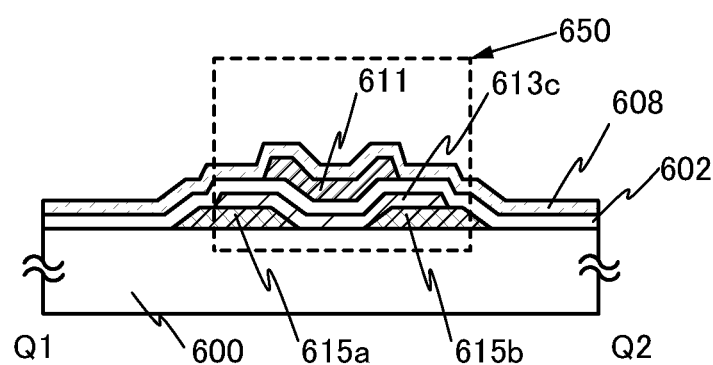

FIGS. 3A and 3B illustrate a structure of a transistor 650 that is a top-gate type manufactured in this embodiment. FIG. 3A is a top view of the transistor 650 and FIG. 3B is a cross-sectional view of the transistor 650. FIG. 3B illustrates a cross section along line Q1-Q2 in FIG. 3A.

In the transistor 650, over a substrate 600 having an insulating surface, a first electrode 615a and a second electrode 615b which serve as a source electrode and a drain electrode are provided. An oxide semiconductor layer 613c which is highly purified and covers end portions of the first electrode 615a and the second electrode 615b, and a gate insulating layer 602 which covers the oxide semiconductor layer 613c are provided. In addition, a gate electrode 611 which is in contact with the gate insulating layer 602 and overlaps with the end portions of the first electrode 615a and the second electrode 615b, and a protective insulating layer 608 which is in contact with the gate electrode 611 and covers the transistor 650 are provided.

Next, a method for manufacturing the transistor 650 over the substrate 600 will be described with reference to FIGS. 4A to 4E.

First, a conductive film for forming the first and second electrodes (including a wiring formed in the same layer as the first and second electrodes) is formed over the substrate 600 having an insulating surface. For the conductive film for forming the first and second electrodes, for example, a metal film containing an element selected from Al, Cr, Cu, Ta, Ti, Mo, and W, a metal nitride film containing any of the above elements as a component (such as a titanium nitride film, a molybdenum nitride film, or a tungsten nitride film), or the like can be used. In addition, a structure in which a film of a metal such as Al or Cu has, on one of or on both the bottom side and the top side, a film of refractory metal such as Ti, Mo, or W, or a metal nitride film thereof (such as a titanium nitride film, a molybdenum nitride film, or a tungsten nitride film)

may be used. A conductive film containing titanium on the side in contact with the oxide semiconductor layer is particularly preferable.

A resist mask is formed over the conductive film through a first photolithography step, and the first electrode 615a and the second electrode 615b serving as a source electrode and a drain electrode are formed by selective etching; then, the resist mask is removed. Note that the resist mask may be formed by an inkjet method. Formation of the resist mask by an inkjet method needs no photomask; thus, manufacturing cost can be reduced.

In this embodiment, as the substrate 600 having an insulating surface, a glass substrate is used.

An insulating film serving as a base film may be provided between the substrate 600 and the first and second electrodes 615a and 615b. The base film has a function of preventing diffusion of impurity elements from the substrate 600, and can be formed to have a single layer or stack structure using one or more of a silicon nitride film, a silicon oxide film, a silicon nitride oxide film, a silicon oxynitride film, and the like.

Then, an oxide semiconductor film with a thickness of greater than or equal to 2 nm and less than or equal to 200 nm, preferably greater than or equal to 5 nm and less than or equal to 30 nm is formed over the first electrode 615a and the second electrode 615b which serve as a source electrode and a drain electrode.

Note that before the oxide semiconductor film is formed by a sputtering method, powdery substances (also referred to as particles or dusts) which are attached on a surface of the first electrode 615a, a surface of the second electrode 615b, and an insulating surface of an exposed portion of the substrate 600 are preferably removed by reverse sputtering in which an argon gas is introduced and plasma is generated.

The oxide semiconductor film described in this embodiment can be formed using a material, a method, and conditions similar to those of the oxide semiconductor film described in Embodiment 1. Specifically, an oxide semiconductor used for the oxide semiconductor film, a deposition method, a target composition, a target filing rate, the purity of a sputtering gas, substrate temperature in deposition, an evacuation unit of a sputtering apparatus, a composition of the sputtering gas, and the like similar to those in Embodiment 1 may be used. Therefore, Embodiment 1 can be referred to for the details.

Next, the oxide semiconductor film is processed into an island-shaped oxide semiconductor layer 613a through a second photolithography step. A resist mask for forming the island-shaped oxide semiconductor layer may be formed by an inkjet method. Formation of the resist mask by an inkjet method needs no photomask; thus, manufacturing cost can be reduced.

Figure 4A:
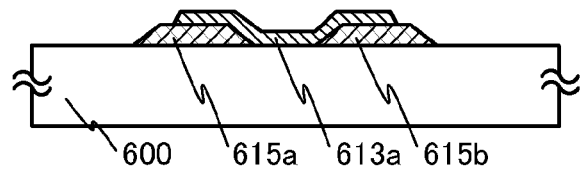
FIGS. 4A to 4E are diagrams illustrating a method for manufacturing a semiconductor device according to an embodiment.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may be used. Note that the cross-sectional view at this stage is illustrated in FIG. 4A.

Figure 4B:
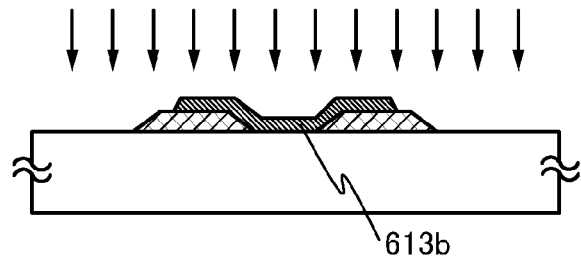
Figure 4C:
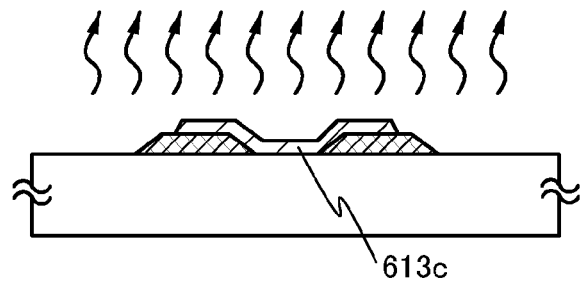

Next, oxygen is added to the oxide semiconductor layer. By an ion implantation method, an ion doping method, or the like, oxygen having high energy is added. By adding oxygen having high energy to the oxide semiconductor by an ion implantation method, an ion doping method, or the like, for example, a bond between hydrogen and metal contained in the oxide semiconductor, a bond between metal and hydroxyl group, or a bond between hydrogen and oxygen in hydroxyl group bonded to metal can be cut. The oxide semiconductor layer 613a is changed into an oxide semiconductor layer 613b which contains impurities eliminated from the metal. FIG. 4B illustrates a cross-sectional view at this stage.

Then, the oxide semiconductor layer 613b which contains the impurities eliminated from the metal is subjected to first heat treatment. Through this first heat treatment, the impurities eliminated from the metal can be removed from the oxide semiconductor layer. For example, water produced by reaction of added oxygen with hydrogen or hydroxyl group eliminated from the metal can be removed. The method in which produced water is removed by heating is easier than a method in which hydrogen or hydroxyl group strongly bonded to metal is directly removed.

The first heat treatment is performed at higher than or equal to 250° C. and lower than or equal to 700° C., preferably higher than or equal to 450° C. and lower than or equal to 650° C., or higher than or equal to 450° C. and lower than the strain point of the substrate. Here, the substrate is put in an electric furnace that is one of heat treatment apparatuses and the heat treatment is performed on the oxide semiconductor layer in a nitrogen atmosphere at 600° C. for one hour, and then water and hydrogen are prevented from entering the oxide semiconductor layer with the oxide semiconductor layer not exposed to the air; thus, an oxide semiconductor layer 613c is obtained (see FIG. 4C).

Note that the heat treatment apparatus is not limited to an electric furnace, and a heating means, a heating method, and heating conditions described in Embodiment 1 can be used. Specifically, a heat treatment apparatus, heating temperature, and the kind, the purity, and the like of a gas used for heating may be similar to those in Embodiment 1. Therefore, Embodiment 1 can be referred to for the details.

In addition, the first heat treatment can be performed on the oxide semiconductor film before being processed into the island-shaped oxide semiconductor layer as long as it is performed after oxygen is added. In that case, the substrate is taken out of the heat treatment apparatus after the first heat treatment, and then a photolithography step is performed.

Note that the first heat treatment may be performed at any of the following timings in addition to the above timing as long as it is performed after formation of the oxide semiconductor layer: after the gate insulating layer is formed over the oxide semiconductor layer, and after the gate electrode is formed over the gate insulating layer.

In addition, as the oxide semiconductor layer, an oxide semiconductor layer having crystal regions (single crystal regions) with a large thickness, that is, crystal regions which are c-axis aligned perpendicularly to the surface of the film may be formed by performing film formation by two steps and heat treatment by two steps, which can be formed regardless of a material of a base component with which the oxide semiconductor layer formed first is in contact, such as an oxide, a nitride, a metal, or the like. Note that the film formation condition described in Embodiment 1 can be used for forming the oxide semiconductor layer including a crystal region. Therefore, Embodiment 1 can be referred to for the details.

Next, by plasma treatment using a gas such as $N_2O$, $N_2$, or Ar, water or the like adsorbed to a surface of an exposed portion of the oxide semiconductor layer may be removed. After plasma treatment is performed, the gate insulating layer 602 which is in contact with the oxide semiconductor layer is formed without being exposed to the air.

As the oxide semiconductor in this embodiment, an oxide semiconductor which is made to be i-type or substantially i-type by removing impurities is used. Such a highly purified oxide semiconductor is highly sensitive to an interface state and interface electric charge; thus, an interface between the oxide semiconductor layer and the gate insulating layer is important. Therefore, the gate insulating layer which is in contact with the highly purified oxide semiconductor layer needs to have high quality.

The gate insulating layer 602 has a thickness of at least 1 nm and can be formed by a method by which an impurity such as water or hydrogen does not enter the gate insulating layer 602, such as a sputtering method, as appropriate. When hydrogen is contained in the gate insulating layer 602, entry of the hydrogen into the oxide semiconductor layer or extraction of oxygen from the oxide semiconductor layer by the hydrogen is caused, thereby causing the backchannel of the oxide semiconductor layer to have lower resistance (to have n-type conductivity), so that a parasitic channel might be formed. Therefore, it is important that a film formation method in which hydrogen is not used be employed in order to form the gate insulating layer 602 containing as little hydrogen as possible.

In this embodiment, as the gate insulating layer 602, a silicon oxide film is formed by a sputtering method. The substrate temperature in film formation may be higher than or equal to room temperature and lower than or equal to 300° C. and is 100° C. in this embodiment. The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target can be used. For example, the silicon oxide film can be formed by a sputtering method with use of a silicon target in an atmosphere containing oxygen. As the gate insulating layer 602 which is formed in contact with the oxide semiconductor layer, an inorganic insulating film which does not contain impurities such as moisture, a hydrogen ion, or OH$^-$ and blocks the entry of these impurities from the outside is used. Typically, a silicon oxide film, a silicon oxynitride film, an aluminum oxide film, an aluminum oxynitride film, or the like is used.

In order to remove residual moisture from the deposition chamber of the gate insulating layer 602 in a manner similar to that of deposition of the oxide semiconductor film, an entrapment vacuum pump (such as a cryopump) is preferably used. When the gate insulating layer 602 is deposited in the deposition chamber evacuated using a cryopump, the impurity concentration in the gate insulating layer 602 can be reduced. In addition, as an evacuation unit for removing the residual moisture from the deposition chamber of the gate insulating layer 602, a turbo pump provided with a cold trap may be used.

Figure 4D:
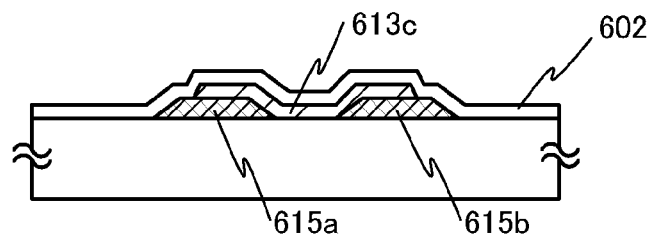

Further, a high-purity gas from which impurities such as hydrogen, water, hydroxyl group, or hydride are removed is preferably used as a sputtering gas used in formation of the gate insulating layer 602. Note that the cross-sectional view at this stage is illustrated in FIG. 4D.

When a contact hole is formed in the gate insulating layer 602, the contact hole is formed by a third photolithography step. Note that the contact hole is not illustrated in FIGS. 4D and 4E.

Then, after a conductive film is formed over the gate insulating layer 602, a wiring layer including the gate electrode 611 is formed by a fourth photolithography step. Note that a resist mask may be formed by an inkjet method. Formation of the resist mask by an inkjet method needs no photomask; thus, manufacturing cost can be reduced.

The gate electrode 611 can be formed to have a single layer or a stack structure using a metal material such as molybdenum, titanium, tantalum, tungsten, aluminum, copper, neodymium, or scandium or an alloy material which contains any of these materials as a main component.

Figure 4E:
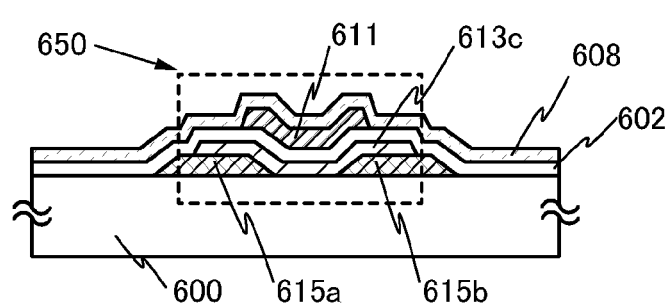

The protective insulating layer 608 may be formed over the gate electrode 611. For example, a silicon nitride film is formed by an RF sputtering method for the protective insulating layer 608. Since an RF sputtering method has high productivity, it is preferably used as a film formation method of the protective insulating layer. As the protective insulating layer, an inorganic insulating film which does not contain an impurity such as moisture and blocks entry of the impurity from the outside, such as a silicon nitride film or an aluminum nitride film, is used. In this embodiment, the protective insulating layer 608 is formed using a silicon nitride film. FIG. 4E is a cross-sectional view at this stage.

In this embodiment, as the protective insulating layer 608, a silicon nitride film is formed by heating the substrate 600 over which layers up to and including the gate electrode 611 are formed to a temperature of 100° C. to 400° C., introducing a sputtering gas containing high-purity nitrogen from which hydrogen and moisture are removed, and using a target of a silicon semiconductor. Also in that case, in a manner similar to that of the gate insulating layer 602, the protective insulating layer 608 is preferably formed while moisture remaining in the treatment chamber is removed.

After the formation of the protective insulating layer, heat treatment may be further performed at a temperature of higher than or equal to 100° C. and lower than or equal to 200° C. in the air for longer than or equal to 1 hour and shorter than or equal to 30 hours. This heat treatment may be performed at a fixed heating temperature. Alternatively, the following change in the heating temperature may be conducted plural times repeatedly: the heating temperature is increased from a room temperature to a temperature of higher than or equal to 100° C. and lower than or equal to 200° C. and then decreased to a room temperature.

In the transistor including the highly purified oxide semiconductor layer which is formed according to this embodiment, variation in threshold voltage is small. Therefore, by employing the method for manufacturing a semiconductor device described in this embodiment, a highly reliable semiconductor device and a semiconductor device with high productivity can be provided.

In addition, since the off-state current can be reduced, a semiconductor device with low power consumption can be provided.

In addition, since the transistor including the highly purified oxide semiconductor layer has high field-effect mobility, high-speed operation is possible. When the transistor including the highly purified oxide semiconductor layer is used in a pixel portion in a liquid crystal display device, a high-quality image can be provided. In addition, by using the transistor including the highly purified oxide semiconductor layer, a driver circuit portion and a pixel portion can be formed over one substrate; thus, the number of components of the liquid crystal display device can be reduced.

This embodiment can be combined with any of other embodiments in this specification as appropriate.

(Embodiment 3)

In this embodiment, a structure and a manufacturing method of a semiconductor device according to an embodiment of the present invention will be described with reference to FIGS. 5A and 5B, FIGS. 6A to 6D, FIGS. 7A to 7C, FIGS. 8A to 8D, and FIGS. 9A to 9C. The semiconductor device described in this embodiment can be used as a memory device.

Figure 5A:
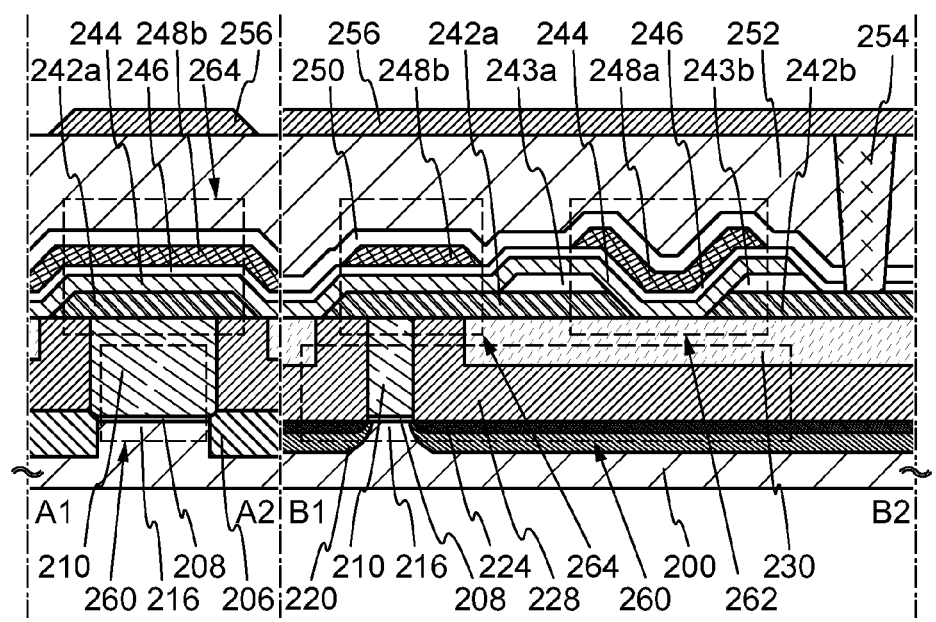
FIGS. 5A and 5B are diagrams illustrating a structure of a semiconductor device according to an embodiment.
Figure 5B:
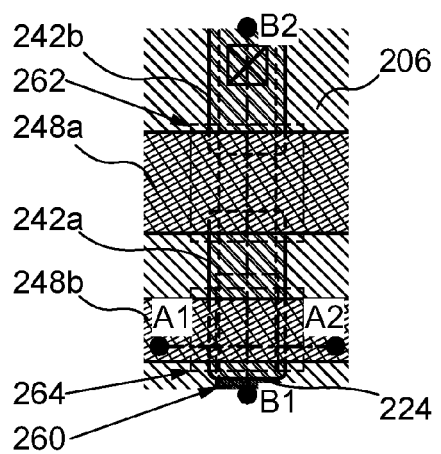

FIGS. 5A and 5B illustrate the structure of the semiconductor device described in this embodiment. FIG. 5A is a cross-sectional view of the semiconductor device, and FIG. 5B is a top view of the semiconductor device. Note that FIG. 5A corresponds to a cross section along line A1-A2 and line B1-B2 in FIG. 5B.

The semiconductor device described in this embodiment includes a transistor 260 formed using a first semiconductor material in a lower portion, a transistor 262 formed using a second semiconductor material in an upper portion, and a capacitor 264. A gate electrode 210 of the transistor 260 is directly connected to a first electrode 242a of the transistor 262.

High integration is possible by providing the transistor 262 and the capacitor 264 overlapping with the transistor 260. For example, given that the minimum feature size is F, the area occupied by a memory cell can be 15 $F^2$ to 25 $F^2$ by devising a connection of a wiring and an electrode.

The first semiconductor material included in the transistor 260 and the second semiconductor material included in the transistor 262 can be different materials from each other. For example, a single crystal semiconductor may be used as the first semiconductor material so that the transistor 260 can be easily operated at high speed, and an oxide semiconductor may be used as the second semiconductor material so that the off-state current of the transistor 262 can be sufficiently reduced and electric charge can be held for a long time.

As the first semiconductor material or the second semiconductor material, for example, an oxide semiconductor or a semiconductor material other than the oxide semiconductor may be used. As the semiconductor material other than the oxide semiconductor, for example, silicon, germanium, silicon germanium, silicon carbide, gallium arsenide, or the like can be used. Besides, an organic semiconductor material and the like can be used.

In this embodiment, the case will be described in which the transistor 260 capable of operating at high speed is formed using single crystal silicon as the first semiconductor material, and the transistor 262 whose off-state current is small is formed using an oxide semiconductor as the second semiconductor material.

Note that the semiconductor device in which the gate electrode 210 of the transistor 260 and the first electrode 242a of the transistor 262 are connected to each other is suitable for a memory device. When the transistor 262 is placed in an off state, the potential of the gate electrode 210 of the transistor 260 can be held for an extremely long time. In addition, by providing the capacitor 264, electric charge given to the gate electrode 210 of the transistor 260 can be easily held and data that is held can be easily read. By using the transistor 260 including a semiconductor material with which high-speed operation is possible, data can be read at high speed.

Although description is made provided that the transistors included in the semiconductor device described in this embodiment are both n-channel transistors, it is needless to say that p-channel transistors can be used. The technical nature of the invention disclosed herein is that a transistor including an oxide semiconductor with a sufficiently reduced off-state current and a transistor including a semiconductor material other than an oxide semiconductor which is capable of sufficiently high-speed operation are provided in combination; thus, it is not necessary to limit specific conditions, such as a material used for the semiconductor device or a structure of the semiconductor device, to those described here.

The transistor 260 includes a channel formation region 216 provided in a substrate 200 including the first semiconductor material, and impurity regions 220 between which the channel formation region 216 is sandwiched. In addition, the transistor 260 includes metal compound regions 224 in contact with the impurity regions 220, a gate insulating layer 208 provided over the channel formation region 216, and the gate electrode 210 provided over the gate insulating layer 208.

Further, an element isolation insulating layer 206 is provided on the substrate 200 so as to surround the transistor 260, and an insulating layer 228 and an insulating layer 230 are provided over the transistor 260. Although not illustrated, part of the metal compound region 224 of the transistor 260 is connected to a wiring 256 or another wiring through an electrode functioning as a source electrode or a drain electrode. Note that also a transistor whose source electrode and drain electrode are not illustrated in the drawing may be referred to as a transistor for the sake of convenience.

Note that in order to obtain high integration, preferably, the transistor 260 does not have a sidewall insulating layer as illustrated in FIGS. 5A and 5B. On the other hand, in the case where characteristics of the transistor 260 are emphasized, a sidewall insulating layer may be provided on a side surface of the gate electrode 210, and the impurity regions 220 may include an impurity region which has an impurity concentration different from that of the impurity regions 220 and is provided in a region overlapping with the sidewall insulating layer.

In this embodiment, as the substrate 200 including the first semiconductor material, a single crystal semiconductor substrate of silicon or the like is used. When the single crystal semiconductor substrate of silicon or the like is used, reading operation of the semiconductor device can be performed at high speed.

The transistor 262 includes a highly purified oxide semiconductor layer as the second semiconductor material. The transistor 262 includes the first electrode 242a and a second electrode 242b which serve as a source electrode and a drain electrode over the insulating layer 230, and an oxide semiconductor layer 244 electrically connected to the first electrode 242a and the second electrode 242b. In addition, the transistor 262 includes a gate insulating layer 246 which covers the oxide semiconductor layer 244, and a gate electrode 248a which is over the gate insulating layer 246 and overlaps with the oxide semiconductor layer 244. An insulating layer 243a is provided between the first electrode 242a and the oxide semiconductor layer 244 so as to overlap with the gate electrode 248a, and an insulating layer 243b is provided between the second electrode 242b and the oxide semiconductor layer 244 so as to overlap with the gate electrode 248a.

With the insulating layer 243a and the insulating layer 243b, capacitance generated between the source and drain electrodes and the gate electrode is reduced.

However, it is also possible to employ a structure in which the insulating layer 243a and the insulating layer 243b are not provided.

Here, the oxide semiconductor layer 244 is preferably a highly purified oxide semiconductor layer obtained by sufficiently removing impurities such as hydrogen or sufficiently supplying oxygen. In this embodiment, an oxide semiconductor layer which is highly purified by the following method is formed: after oxygen is added to the oxide semiconductor layer, heat treatment is performed so as to remove impurities and highly purify the oxide semiconductor layer. In this manner, by using a highly purified oxide semiconductor, the transistor 262 with excellent off-state current characteristics can be obtained. Embodiment 2 can be referred to for the details of the oxide semiconductor layer 244.

Although the oxide semiconductor layer 244 which is processed to have an island shape is used in order to suppress leakage current generated between elements due to miniaturization in the transistor 262 in FIGS. 5A and 5B, a structure including the oxide semiconductor layer 244 which is not processed to have an island shape may be employed. In the case where the oxide semiconductor layer is not processed to have an island shape, contamination of the oxide semiconductor layer 244 due to etching in the processing can be prevented.

In the semiconductor device illustrated in FIGS. 5A and 5B, the top surface of the gate electrode 210 of the transistor 260 is not covered by the insulating layer 230 and directly connected to the first electrode 242a serving as a source electrode or a drain electrode of the transistor 262. Although the gate electrode 210 and the first electrode 242a can be connected to each other using an opening and an electrode for contact which are additionally provided, by directly connecting the gate electrode 210 and the first electrode 242a, contact area can be reduced and the semiconductor device can be highly integrated.

For example, when the semiconductor device of this embodiment is used as a memory device, high integration is important in order to increase storage capacity per unit area. In addition, since a step necessary for additionally providing an opening and an electrode for contact can be omitted, the manufacturing process of the semiconductor device can be simple.

The capacitor 264 in FIGS. 5A and 5B includes the first electrode 242a functioning as a source or drain electrode, the oxide semiconductor layer 244, the gate insulating layer 246, and an electrode 248b. That is, the first electrode 242a functions as one electrode of the capacitor 264, and the electrode 248b functions as the other electrode of the capacitor 264.

The capacitor 264 illustrated in FIGS. 5A and 5B includes the oxide semiconductor layer 244 and the gate insulating layer 246 between the first electrode 242a and the electrode 248b. However, the capacitor 264 may include only the gate insulating layer 246 so as to have large capacitance. In addition, it is also possible to employ a structure in which an insulating layer formed in a manner similar to that of the insulating layer 243a is provided. Further, if a capacitor is not needed, a structure in which the capacitor 264 is not provided may be employed.

Further, an insulating layer 250 is provided over the transistor 262 and the capacitor 264, and an insulating layer 252 is provided over the insulating layer 250. An electrode 254 is provided in an opening formed in the gate insulating layer 246, the insulating layer 250, the insulating layer 252, and the like. A wiring 256 is provided over the insulating layer 252 and is electrically connected to the second electrode 242b through the electrode 254. Note that the wiring 256 may be directly in contact with the second electrode 242b.

In addition, the electrode (not illustrated) connected to the metal compound region 224 may be connected to the second electrode 242b. In this case, when the electrode connected to the metal compound region 224 is provided so as to overlap with the electrode 254, the semiconductor device can be highly integrated.

<Method for Manufacturing Semiconductor Device>

Next, an example of a method for manufacturing the semiconductor device will be described. First, a method for manufacturing the transistor 260 in the lower portion will be described with reference to FIGS. 6A to 6D and FIGS. 7A to 7C, and then a method for manufacturing the transistor 262 in the upper portion and the capacitor 264 will be described with reference to FIGS. 8A to 8D and FIGS. 9A to 9C.

<Method for Manufacturing Transistor in Lower Portion>

Figure 6A:
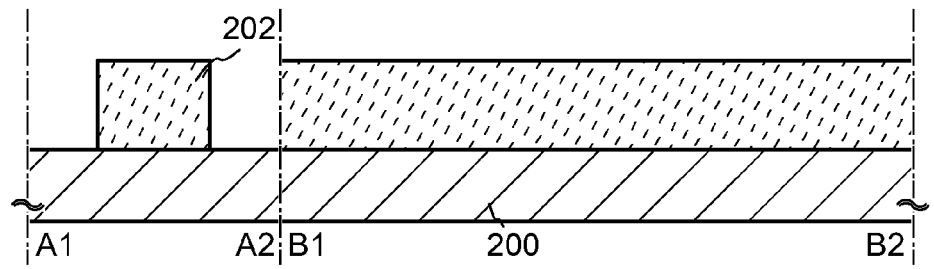
FIGS. 6A to 6D are diagrams illustrating a method for manufacturing a semiconductor device according to an embodiment.
Figure 6B:
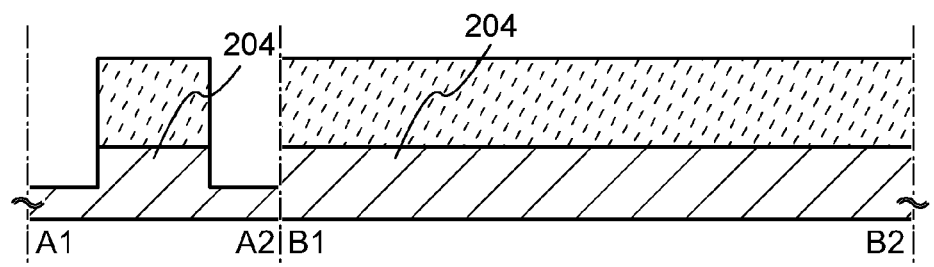

First, the substrate 200 including a semiconductor material is prepared (see FIG. 6A). A single crystal semiconductor substrate or a polycrystalline semiconductor substrate of silicon, silicon carbide, or the like, a compound semiconductor substrate of silicon germanium or the like, an SOI substrate, or the like can be used as the substrate 200 including a semiconductor material. Here, an example of the case in which a single crystal silicon substrate is used as the substrate 200 including a semiconductor material is described.

Note that in general, the term "SOI substrate" means a substrate in which a silicon semiconductor layer is provided on an insulating surface. In this specification and the like, the term "SOI substrate" also includes a substrate in which a semiconductor layer formed using a material other than silicon is provided on an insulating surface in its category. That is, a semiconductor layer included in the "SOI substrate" is not limited to a silicon semiconductor layer. Examples of the SOI substrate include a substrate which has a semiconductor layer over an insulating substrate such as a glass substrate, with an insulating layer between the semiconductor layer and the insulating substrate.

A single crystal semiconductor substrate of silicon or the like is preferably used as the substrate 200 including a semiconductor material because the transistor 260 can be operated at higher speed.

A protective layer 202 serving as a mask for forming the element isolation insulating layer is formed over the substrate 200 (see FIG. 6A). As the protective layer 202, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 200 in order to control the threshold voltage of the transistor. When the semiconductor material is silicon, phosphorus, arsenic, or the like can be used as the impurity element imparting n-type conductivity, for example. In addition, boron, aluminum, gallium, or the like can be used as the impurity element imparting p-type conductivity, for example.

Next, part of the substrate 200 in a region that is not covered with the protective layer 202 (i.e., in an exposed region) is removed by etching using the protective layer 202 as a mask. By this etching, a semiconductor region 204 that is separated from other semiconductor regions is formed (see FIG. 6B). As the etching, dry etching is preferably performed, but wet etching can be performed. An etching gas and an etchant can be selected as appropriate depending on a material etched off.

Figure 6C:
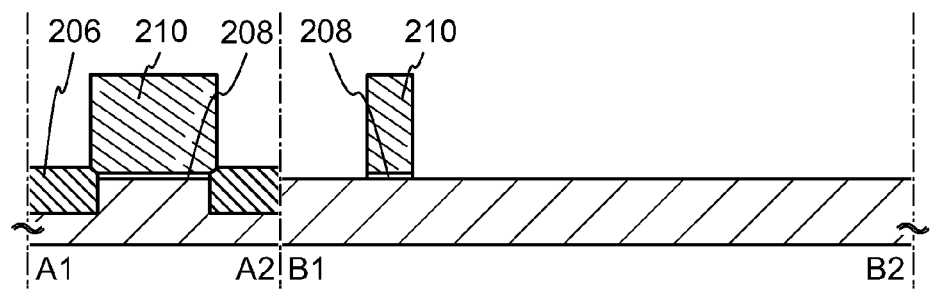

Then, an insulating layer is formed so as to cover the semiconductor region 204, and the insulating layer in a region overlapping with the semiconductor region 204 is selectively removed, so that the element isolation insulating layer 206 is formed (see FIG. 6C). The insulating layer is formed using silicon oxide, silicon nitride, silicon oxynitride, or the like. As a method for removing the insulating layer, there are etching treatment, polishing treatment such as chemical mechanical polishing (CMP) treatment, and the like. Any of them can be employed, or two or more of them may be combined. After the semiconductor region 204 is formed or after the element isolation insulating layer 206 is formed, the protective layer 202 is removed.

Note that as a formation method of the element isolation insulating layer 206, a method in which an insulating region is formed by introduction of oxygen or the like can be used, in addition to a method in which an insulating layer is selectively removed.

Next, an insulating layer is formed over the surface of the semiconductor region 204, and a layer containing a conductive material is formed over the insulating layer.

The insulating layer becomes a gate insulating layer later and can be formed by performing heat treatment (e.g., thermal oxidation treatment or thermal nitridation treatment) on the surface of the semiconductor region 204, for example. Instead of the heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, hydrogen, and the like. Needless to say, the insulating layer may be formed by a CVD method, a sputtering method, or the like. The insulating layer preferably has a single layer or a stack structure using one or more of silicon oxide, silicon oxynitride, silicon nitride, hafnium oxide, aluminum oxide, tantalum oxide, yttrium oxide, hafnium silicate ($HfSi_xO_y$ (x>0 and y>0)), hafnium silicate ($HfSi_xO_y$ (x>0 and y>0)) to which nitrogen is added, hafnium aluminate ($HfAl_xO_y$ (x>0 and y>0)) to which nitrogen is added, and the like. The insulating layer can have a thickness of, for example, greater than or equal to 1 nm and less than or equal to 100 nm, preferably greater than or equal to 10 nm and less than or equal to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and any of a variety of film formation methods such as an evaporation method, a CVD method, a sputtering method, and a spin coating method can be employed. Note that this embodiment shows an example of the case in which the layer containing a conductive material is formed using a metal material.

After that, the insulating layer and the layer containing a conductive material are selectively etched, thereby forming the gate insulating layer 208 and the gate electrode 210 (see FIG. 6C).

Figure 6D:
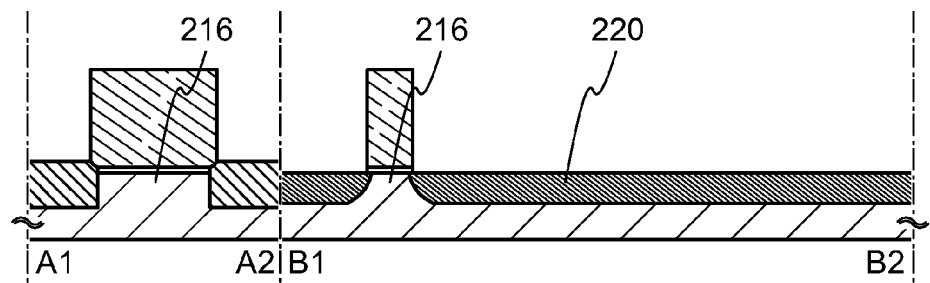

Next, phosphorus (P), arsenic (As), or the like is added to the semiconductor region 204, so that the channel formation region 216 and the impurity regions 220 are formed (see FIG. 6D). Note that phosphorus or arsenic is added here in order to form an n-channel transistor; an impurity element such as boron (B) or aluminum (Al) may be added in the case of forming a p-channel transistor. Here, the concentration of the added impurity element can be set as appropriate; the concentration is preferably increased when the size of a semiconductor element is extremely decreased.

Note that a sidewall insulating layer may be formed in the periphery of the gate electrode 210 so that an impurity region to which an impurity element is added at a different concentration may be formed.

Figure 7A:
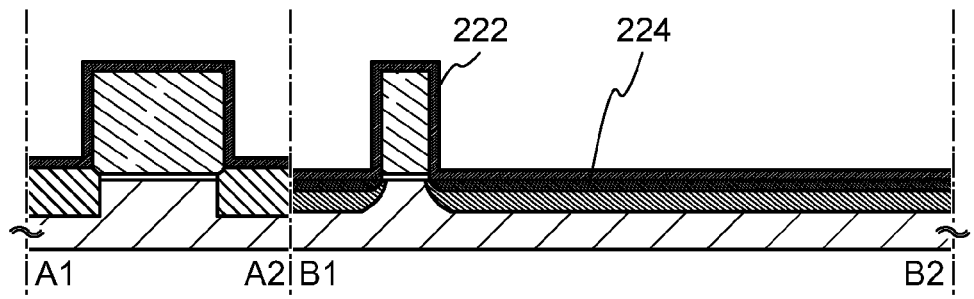
FIGS. 7A to 7C are diagrams illustrating a method for manufacturing a semiconductor device according to an embodiment.

Next, a metal layer 222 is formed so as to cover the gate electrode 210, the impurity regions 220, and the like (see FIG. 7A). Any of a variety of film formation methods such as a vacuum evaporation method, a sputtering method, and a spin coating method is applicable to formation of the metal layer 222. The metal layer 222 is preferably formed using a metal material that reacts with a semiconductor material contained in the semiconductor region 204 to be a low-resistance metal compound. Examples of such a metal material include titanium, tantalum, tungsten, nickel, cobalt, and platinum.

Next, heat treatment is performed, whereby the metal layer 222 reacts with the semiconductor material. Thus, the metal compound regions 224 that are in contact with the impurity regions 220 are formed (see FIG. 7A). Note that when the gate electrode 210 is formed using polycrystalline silicon or the like, a metal compound region is also formed in a region of the gate electrode 210 which is in contact with the metal layer 222.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 222 is removed after the metal compound regions 224 are formed.

Figure 7B:
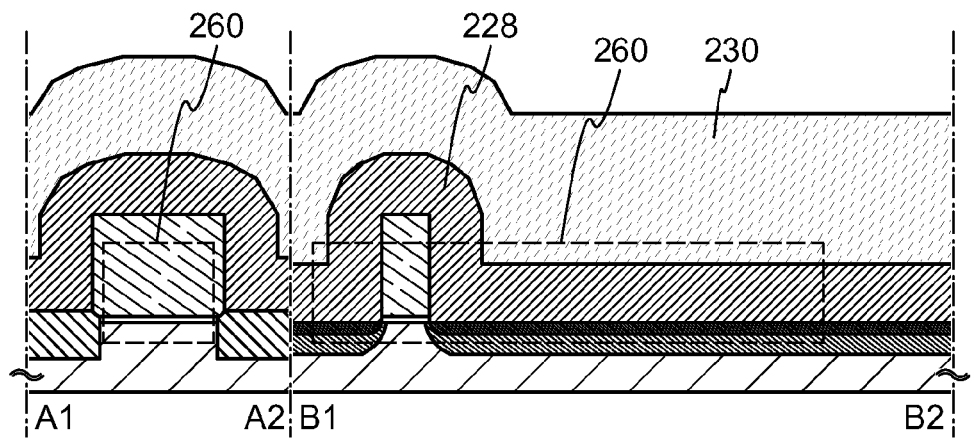

Then, the insulating layer 228 and the insulating layer 230 are formed so as to cover the components formed in the above steps (see FIG. 7B). The insulating layer 228 and the insulating layer 230 can be formed using a material containing an inorganic insulating material such as silicon oxide, silicon oxynitride, or aluminum oxide. In particular, the insulating layer 228 and the insulating layer 230 are preferably formed using a low dielectric constant (low-k) material, whereby capacitance caused by an overlap of electrodes or wirings can be sufficiently reduced. Note that a porous insulating layer containing these materials may be used for the insulating layer 228 and the insulating layer 230. Since the porous insulating layer has a low dielectric constant as compared to a dense insulating layer, capacitance due to electrodes or wirings can be further reduced.

In addition, a layer including an inorganic insulating material containing a large amount of nitrogen, such as silicon nitride oxide or silicon nitride, may be included in the insulating layer 228 or the insulating layer 230. Thus, impurities such as water or hydrogen contained in the material included in the transistor 260 in the lower portion can be prevented from entering the oxide semiconductor layer 244 of the transistor 262 in the upper portion that is formed later. Note that in this case, it is difficult to remove the layer including an inorganic insulating material containing a large amount of nitrogen only by CMP treatment in a later step; therefore, CMP treatment and etching treatment are preferably performed in combination.

For example, silicon oxynitride and silicon oxide can be used for forming the insulating layer 228 and the insulating layer 230, respectively. When only an inorganic insulating material containing a large amount of oxygen, such as silicon oxynitride or silicon oxide, is used for the insulating layer 228 and the insulating layer 230 in this manner, CMP treatment can be easily performed on the insulating layer 228 and the insulating layer 230 in a later step.

Note that a stack structure of the insulating layer 228 and the insulating layer 230 is used in this embodiment; however, an embodiment of the invention disclosed herein is not limited to this example. A single-layer structure or a stack structure including three or more layers can be used. For example, the following structure may be employed: silicon oxynitride and silicon oxide are used for the insulating layer 228 and the insulating layer 230, respectively, and a silicon nitride oxide film is formed between the insulating layer 228 and the insulating layer 230.

Figure 7C:
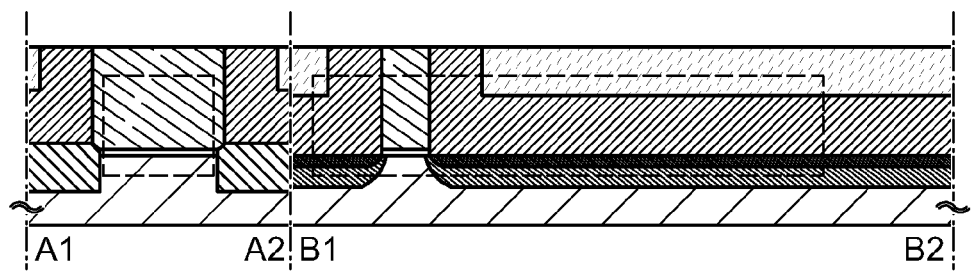

After that, as treatment before formation of the transistor 262, CMP treatment is performed on the insulating layer 228 and the insulating layer 230, so that surfaces of the insulating layer 228 and the insulating layer 230 are planarized and a top surface of the gate electrode 210 is exposed (see FIG. 7C).

The CMP treatment may be performed once or plural times. When the CMP treatment is performed plural times, first polishing is preferably performed with a high polishing rate followed by final polishing with a low polishing rate. By combining polishing with different polishing rates in this manner, planarity of the surfaces of the insulating layer 228 and the insulating layer 230 can be further improved.

In addition, when the stack structure of the insulating layer 228 and the insulating layer 230 includes an inorganic insulating material containing a large amount of nitrogen, since it is difficult to remove the inorganic insulating material containing a large amount of nitrogen only by the CMP treatment, CMP treatment and etching treatment are preferably performed in combination. As the etching treatment for the inorganic insulating material containing a large amount of nitrogen, either dry etching or wet etching may be used. In view of miniaturization of elements, dry etching is preferably used. In addition, it is preferable that etching conditions (an etching gas, an etchant, an etching time, a temperature, or the like) be set appropriately so that etching rates of the insulating layers are equal to each other and high etching selectivity with respect to the gate electrode 210 can be obtained. In addition, as an etching gas for dry etching, for example, a gas containing fluorine (such as trifluoromethane ($CHF_3$)), a gas containing fluorine to which a rare gas such as helium (He) or argon (Ar) is added, or the like can be used.

In addition, when the top surface of the gate electrode 210 is exposed from the insulating layer 230, the top surface of the gate electrode 210 and the surface of the insulating layer 230 preferably lie in the same plane.

Note that before or after each of the above steps, a step for forming an electrode, a wiring, a semiconductor layer, or an insulating layer may be further provided. For example, an electrode which is connected to part of the metal compound region 224 and functions as a source or drain electrode of the transistor 260 may be formed. In addition, when the wiring has a multi-layer structure obtained by stacking an insulating layer and a conductive layer, a highly integrated semiconductor device can be achieved.

<Method for Manufacturing Transistor in Upper Portion>

Figure 8A:
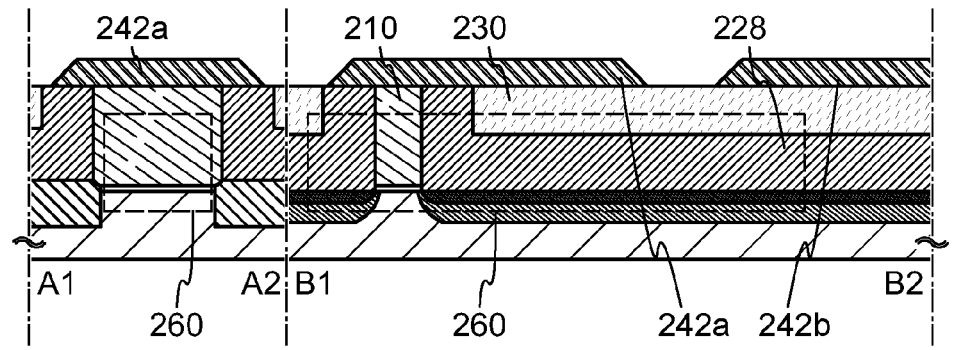
FIGS. 8A to 8D are diagrams illustrating a method for manufacturing a semiconductor device according to an embodiment.

Then, a conductive layer is formed over the gate electrode 210, the insulating layer 228, the insulating layer 230, and the like, and the conductive layer is selectively etched, so that the first electrode 242a and the second electrode 242b functioning as source and drain electrodes are formed (see FIG. 8A). The first electrode 242a and the second electrode 242b can be formed using a material and a method similar to those of the electrodes functioning as source and drain electrodes described in Embodiment 2. Therefore, Embodiment 2 can be referred to for the details.

Here, the first electrode 242a and the second electrode 242b are etched so as to have tapered end portions. With the tapered end portions of the first electrode 242a and the second electrode 242b, the oxide semiconductor layer to be formed later can easily cover the end portions and disconnection can be prevented. In addition, coverage with the gate insulating layer to be formed later can be improved and disconnection can be prevented.

Here, the taper angle is, for example, greater than or equal to 30° and less than or equal to 60°. Note that the taper angle is a tilt angle formed by a side surface and a bottom surface of a layer having a tapered shape (e.g., the first electrode 242a) in the case where the layer is observed from a direction perpendicular to a cross section (a plane perpendicular to the surface of a substrate).

The channel length (L) of the transistor in the upper portion is determined by the distance between a lower end of the first electrode 242a and a lower end of the second electrode 242b. Note that in light exposure for forming a mask that is used in the case where a transistor with a channel length (L) of shorter than 25 nm is formed, it is preferable to use extreme ultraviolet light whose wavelength is as short as several nanometers to several tens of nanometers. In the light exposure by extreme ultraviolet light, the resolution is high and the focus depth is large. For these reasons, the channel length (L) of the transistor to be formed later can be longer than or equal to 10 nm and shorter than or equal to 1000 nm (1 μm), and the circuit can operate at higher speed. Moreover, miniaturization can lead to low power consumption of the semiconductor device.

Here, the first electrode 242a of the transistor 262 and the gate electrode 210 of the transistor 260 are directly connected to each other (see FIG. 8A).

Figure 8B:
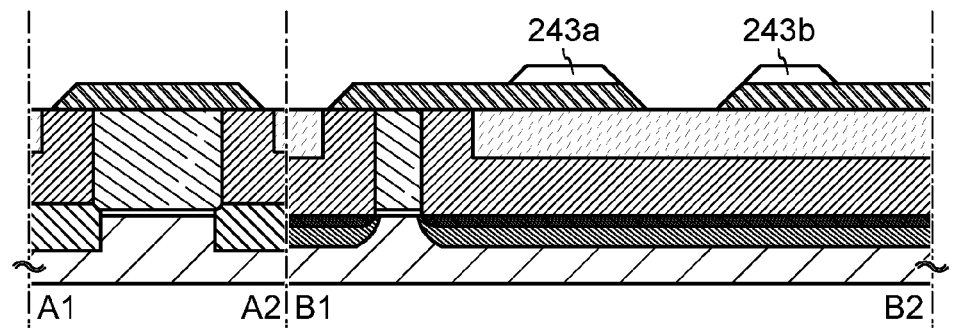

Then, the insulating layer 243a and the insulating layer 243b are formed over the first electrode 242a and the second electrode 242b, respectively (see FIG. 8B). The insulating layer 243a and the insulating layer 243b can be formed in such a manner that an insulating layer covering the first electrode 242a and the second electrode 242b is formed, and then the insulating layer is selectively etched. In addition, the insulating layer 243a and the insulating layer 243b are formed so as to overlap with part of the gate electrode formed later. By providing such an insulating layer, capacitance between the gate electrode and the source or drain electrode can be reduced.

The insulating layer 243a and the insulating layer 243b can be formed using an inorganic insulating material such as silicon oxide, silicon oxynitride, silicon nitride, or aluminum oxide. In particular, it is preferable that the insulating layer 243a and the insulating layer 243b be formed using a low dielectric constant (low-k) material, because capacitance between the gate electrode and the source or drain electrode can be sufficiently reduced. Note that a porous insulating layer containing any of these materials may be used for the insulating layer 243a and the insulating layer 243b. Since the porous insulating layer has a low dielectric constant as compared to a dense insulating layer, capacitance between the gate electrode and the source or drain electrode can be further reduced.

Note that in view of reduction in the capacitance between the gate electrode and the source or drain electrode, the insulating layer 243a and the insulating layer 243b are preferably formed; however, a structure without the insulating layer 243a and the insulating layer 243b may be employed.

Figure 8C:
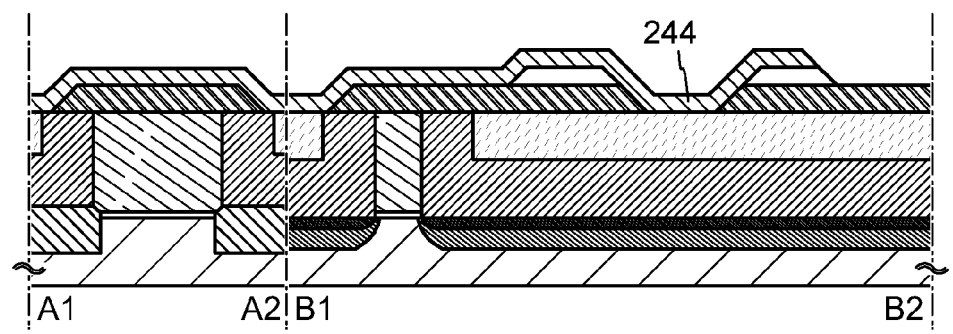

Next, an oxide semiconductor layer is formed so as to cover the first electrode 242a and the second electrode 242b, and then the oxide semiconductor layer is selectively etched, so that the oxide semiconductor layer 244 is formed (see FIG. 8C). The oxide semiconductor layer 244 can be formed using a material and a method similar to those of the oxide semiconductor layer described in Embodiment 2. Therefore, Embodiment 2 can be referred to for the details.

Note that as described in Embodiment 2, before the oxide semiconductor layer is formed by a sputtering method, a substance attached to a surface over which the oxide semiconductor layer is formed (e.g., a surface of the insulating layer 230) is preferably removed by reverse sputtering in which an argon gas is introduced and plasma is generated.

Oxygen is added to the oxide semiconductor layer, and then, heat treatment (first heat treatment) is performed. For the oxygen addition treatment and the heat treatment (the first heat treatment), the apparatus and the method described in Embodiment 2 can be employed. Therefore, Embodiment 2 can be referred to for the details.

By adding oxygen to the oxide semiconductor layer and performing the heat treatment (the first heat treatment), residual impurities in the oxide semiconductor layer are reduced, whereby an i-type (intrinsic) or substantially i-type oxide semiconductor layer can be formed. In the transistor including the i-type (intrinsic) or substantially i-type oxide semiconductor layer in which the residual impurities are reduced, variation in threshold voltage can be suppressed and the off-state current can be reduced, that is, excellent characteristics can be achieved.

The oxide semiconductor layer may be etched either before or after the heat treatment (the first heat treatment). In view of miniaturization of elements, dry etching is preferably used; however, wet etching may be used. An etching gas and an etchant can be selected as appropriate depending on a material etched off. Note that in the case where leakage current in an element does not cause a problem, the oxide semiconductor layer may be used without being processed to have an island shape.

Figure 8D:
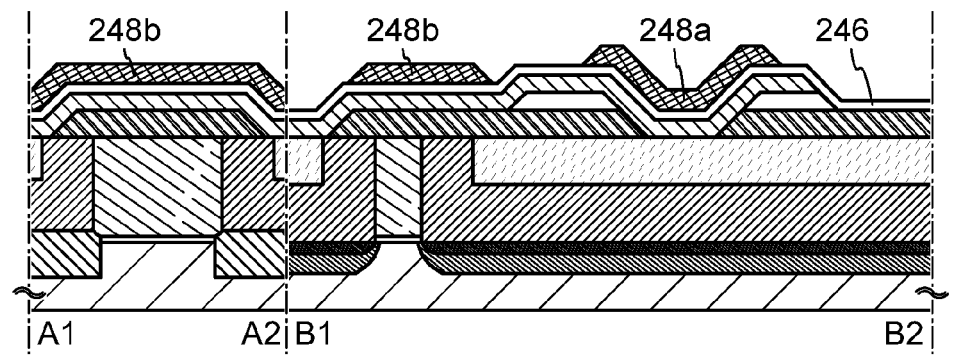

Next, the gate insulating layer 246 in contact with the oxide semiconductor layer 244 is formed, and then the gate electrode 248a and the electrode 248b are formed in regions overlapping with the oxide semiconductor layer 244 and the first electrode 242a, respectively, over the gate insulating layer 246 (see FIG. 8D). The gate insulating layer 246 can be formed using a material and a method similar to those of the gate insulating layer described in Embodiment 2.

After the gate insulating layer 246 is formed, second heat treatment is desirably performed in an inert gas atmosphere or an oxygen atmosphere. The second heat treatment can be performed in a manner similar to that in Embodiment 2. The second heat treatment can reduce variation in electric characteristics of the transistor. Moreover, in the case where the gate insulating layer 246 contains oxygen, oxygen is supplied to the oxide semiconductor layer 244 to compensate for oxygen deficiency in the oxide semiconductor layer 244, whereby an i-type (intrinsic) or substantially i-type oxide semiconductor layer can be formed.

Note that although the second heat treatment is performed in this embodiment after the gate insulating layer 246 is formed, the timing of the second heat treatment is not limited thereto. For example, the second heat treatment may be performed after the gate electrode is formed. Alternatively, the second treatment may also serve as the first heat treatment As described above, by performing at least one of the first heat treatment and the second heat treatment after addition of oxygen, the oxide semiconductor layer 244 can be highly purified so as not to contain an impurity that is not a main component thereof as much as possible.

The gate electrode 248a can be formed using a material and a method similar to those of the gate electrode 611 described in Embodiment 2. In addition, the electrode 248b can be formed by selectively etching the conductive layer, at the same time as the formation of the gate electrode 248a. Embodiment 2 can be referred to for the details.

Figure 9A:
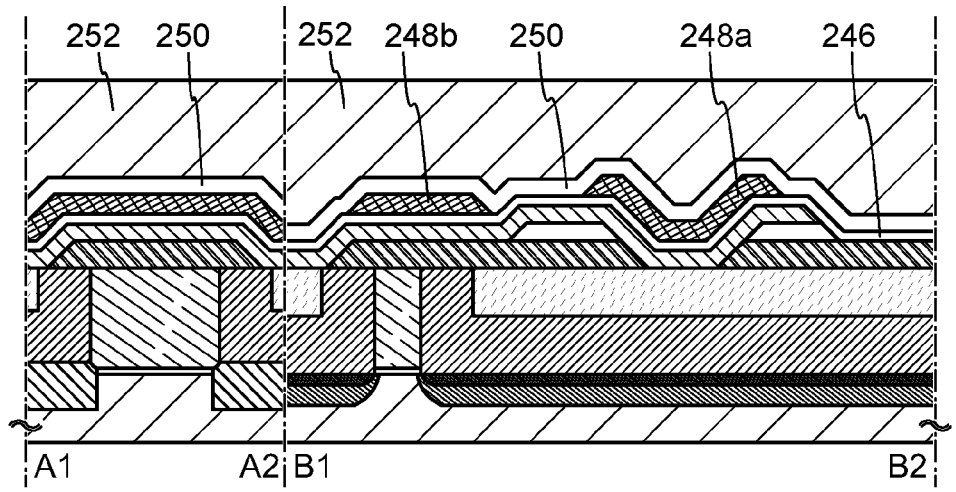
FIGS. 9A to 9C are diagrams illustrating a method for manufacturing a semiconductor device according to an embodiment.

Next, the insulating layer 250 and the insulating layer 252 are formed over the gate insulating layer 246, the gate electrode 248a, and the electrode 248b (see FIG. 9A). The insulating layer 250 and the insulating layer 252 can be formed using materials and methods similar to those of the insulating layer 507 and the protective insulating layer 508 described in Embodiment 1. Therefore, Embodiment 1 can be referred to for the details.

Figure 9B:
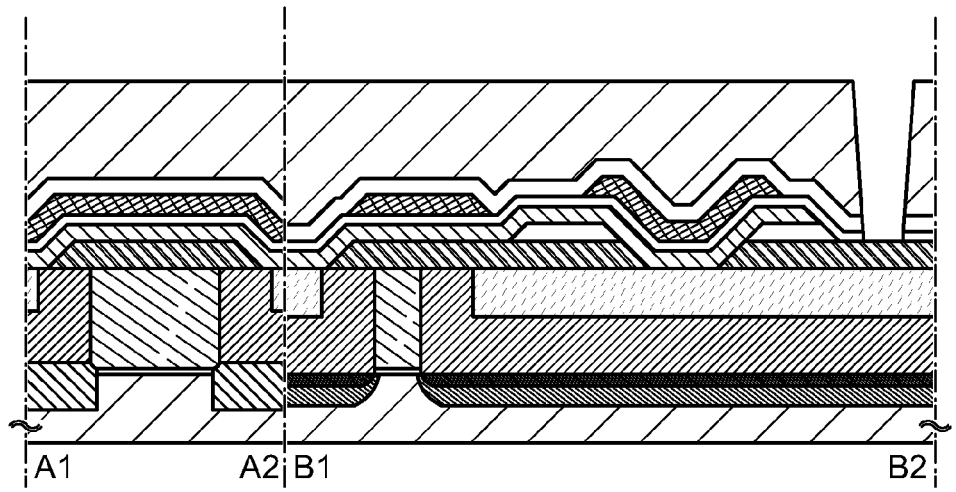

Next, an opening which reaches the second electrode 242b is formed in the gate insulating layer 246, the insulating layer 250, and the insulating layer 252 (see FIG. 9B). The opening is formed by selective etching with the use of a mask or the like.

Figure 9C:
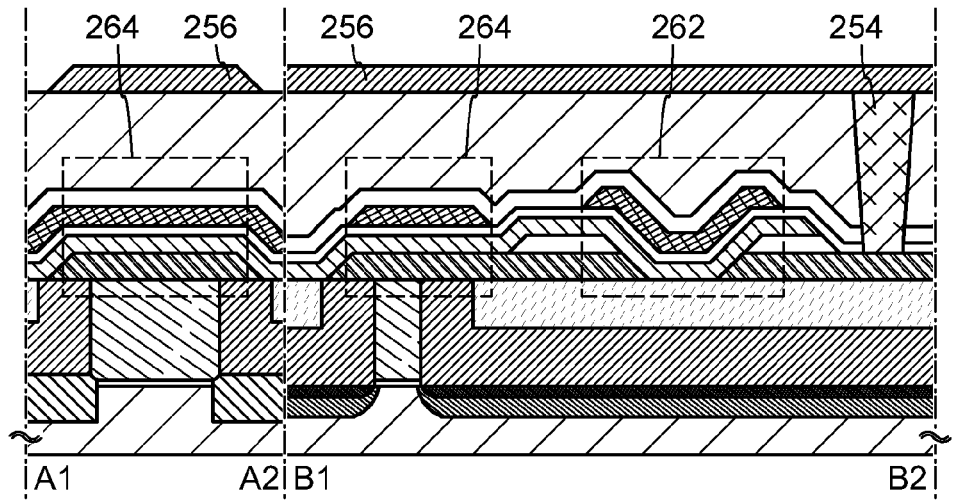

Then, the electrode 254 is formed in the opening, and the wiring 256 in contact with the electrode 254 is formed over the insulating layer 252 (see FIG. 9C).

For example, the electrode 254 can be formed in the following manner: a conductive layer is formed in a region including the opening by a PVD method, a CVD method, or the like, and then, the conductive layer is partly removed by a method such as etching treatment or CMP.

More specifically, it is possible to employ a method in which a thin titanium film is formed by a PVD method and a thin titanium nitride film is formed by a CVD method in a region including the opening, and then, a tungsten film is formed so as to be embedded in the opening. Here, the titanium film formed by a PVD method has a function of reducing an oxide film (e.g., a native oxide film) over a surface where the electrode is formed, to decrease the contact resistance with the lower electrode or the like (e.g., the second electrode 242b, here). The titanium nitride film formed after the formation of the titanium film has a barrier function of preventing diffusion of the conductive material. A copper film may be formed by a plating method after the formation of the barrier film of titanium, titanium nitride, or the like.

In the case where the electrode 254 is formed by removing part of the conductive layer, it is preferable that a surface thereof be processed to be flat. For example, when the thin titanium film and the thin titanium nitride film are formed in a region including the opening and then the tungsten film is formed so as to be embedded in the opening, by subsequent CMP treatment, excess tungsten, titanium, titanium nitride, and the like can be removed and the planarity of the surface can be improved.

A favorable electrode, wiring, insulating layer, semiconductor layer, or the like can be formed in later steps by such an improvement in flatness of the surface including the electrode 254.

The wiring 256 can be formed using a material and a method similar to those of the wiring including the gate electrode 611 described in Embodiment 2. Therefore, Embodiment 2 can be referred to for the details.

Through the above steps, the transistor 262 including the highly purified oxide semiconductor layer 244 and the capacitor 264 are completed (see FIG. 9C).

With the use of the highly purified and intrinsic oxide semiconductor layer 244, the off-state current of the transistor can be sufficiently reduced. With the use of such a transistor, a semiconductor device in which stored data can be held for an extremely long time can be provided.

In accordance with the method described in this embodiment, the semiconductor device can be provided, which includes the transistor including a semiconductor material other than an oxide semiconductor in the lower portion and the transistor including an oxide semiconductor in the upper portion.

When the gate electrode 210 and the first electrode 242a are directly connected to each other, higher integration of the semiconductor device can be achieved because a contact area can be reduced. Accordingly, a storage capacity per unit area of the semiconductor device which can be used as a memory device can be increased.

The structures, methods, and the like described in this embodiment can be combined as appropriate with any of the structures, methods, and the like described in other embodiments.

(Embodiment 4)

In this embodiment, application examples of a semiconductor device according to an embodiment of the invention disclosed herein will be described with reference to FIGS. 13A-1 to 13B. Here, an example of a memory device will be described. Note that in some circuit diagrams, "OS" is written beside a transistor in order to indicate that the transistor includes an oxide semiconductor.

Figures 1, 13A:
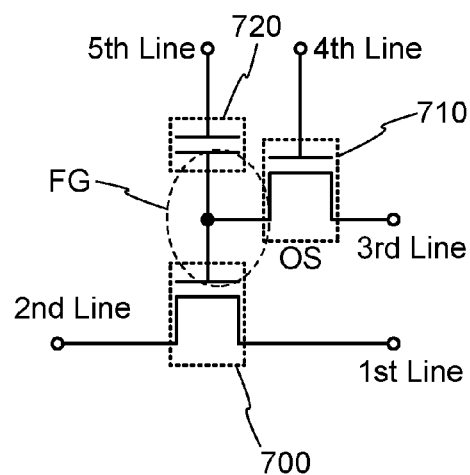
FIGS. 13A-1 to 13B are circuit diagrams of a semiconductor device according to an embodiment.

In a semiconductor device illustrated in FIG. 13A-1, a first wiring (a 1st line) is electrically connected to a source electrode of a transistor 700, and a second wiring (a 2nd line) is electrically connected to a drain electrode of the transistor 700. A gate electrode of the transistor 700 and one of a source electrode and a drain electrode of a transistor 710 are electrically connected to one electrode of a capacitor 720. A fifth wiring (a 5th line) is electrically connected to the other electrode of the capacitor 720. A third wiring (a 3rd line) is electrically connected to the other of the source electrode and the drain electrode of the transistor 710, and a fourth wiring (a 4th line) is electrically connected to a gate electrode of the transistor 710.

Here, a transistor including an oxide semiconductor is used as the transistor 710. In this embodiment, for example, the transistor 262 described in the above embodiment can be used as the transistor including an oxide semiconductor. The transistor including an oxide semiconductor has a characteristic of a significantly small off-state current. Therefore, when the transistor 710 is placed in an off state, the potential of the gate electrode of the transistor 700 can be held for an extremely long time. By providing the capacitor 720, electric charge supplied to the gate electrode of the transistor 700 can be easily held and stored data can be easily read. In this embodiment, for example, the capacitor 264 described in the above embodiment can be used as the capacitor 720.

In addition, a transistor including a semiconductor material other than an oxide semiconductor is used for the transistor 700. Note that as the semiconductor material other than an oxide semiconductor, for example, silicon, germanium, silicon germanium, silicon carbide, gallium arsenide, or the like can be used, and a single crystal semiconductor is preferably used. Moreover, an organic semiconductor material or the like can be used. A transistor including such a semiconductor material can operate at high speed easily. In this embodiment, for example, the transistor 260 described in the above embodiment can be used as the transistor including a semiconductor material other than an oxide semiconductor.

Figure 13B:
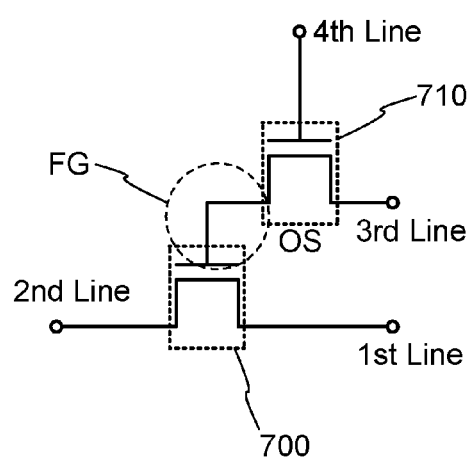

Alternatively, a structure without the capacitor 720 as illustrated in FIG. 13B can be employed.

The semiconductor device illustrated in FIG. 13A-1 utilizes a characteristic in which the potential of the gate electrode of the transistor 700 can be held, whereby writing, holding, and reading of data is possible as described below.

First, writing and holding of data will be described. First, the potential of the fourth wiring is set to a potential at which the transistor 710 is turned on, so that the transistor 710 is turned on. Accordingly, the potential of the third wiring is supplied to the gate electrode of the transistor 700 and the capacitor 720. That is, a predetermined electric charge is supplied to the gate electrode of the transistor 700 (writing). Here, one of two kinds of electric charge for supplying different potentials (hereinafter, an electric charge for supplying a low potential is referred to as an electric charge $Q_L$ and an electric charge for supplying a high potential is referred to as an electric charge $Q_H$) is supplied to the gate electrode of the transistor 700. Note that three or more kinds of electric charge for supplying different potentials may be used to improve storage capacity. After that, the potential of the fourth wiring is set to a potential at which the transistor 710 is turned off, so that the transistor 710 is turned off. Thus, the electric charge supplied to the gate electrode of the transistor 700 is held (holding).

Since the off-state current of the transistor 710 is extremely small, the electric charge of the gate electrode of the transistor 700 is held for a long time.

Next, reading of data will be described. By supplying an appropriate potential (reading potential) to the fifth wiring while a predetermined potential (constant potential) is supplied to the first wiring, the potential of the second wiring varies depending on the amount of electric charge held in the gate electrode of the transistor 700. This is because in general, when the transistor 700 is an n-channel transistor, an apparent threshold voltage $V_{th\_H}$ in the case where $Q_H$ is supplied to the gate electrode of the transistor 700 is lower than an apparent threshold voltage $V_{th\_L}$ in the case where $Q_L$ is supplied to the gate electrode of the transistor 700. Here, an apparent threshold voltage refers to the potential of the fifth wiring, which is needed to turn on the transistor 700. Thus, when the potential of the fifth wiring is set to a potential $V_0$ which is intermediate between $V_{th\_H}$ and $V_{th\_L}$, an electric charge supplied to the gate electrode of the transistor 700 can be determined. For example, in the case where $Q_H$ is supplied in writing, when the potential of the fifth wiring is set to $V_0$ ($>V_{th\_H}$), the transistor 700 is turned on. In the case where $Q_L$ is supplied in writing, even when the potential of the fifth wiring is set to $V_0$ ($<V_{th\_L}$), the transistor 700 remains in an off state. Therefore, the data that is held can be read by utilizing the potential of the second wiring.

Note that in the case where memory cells are arrayed, it is necessary to read only data of desired memory cells. Thus, in order that data of predetermined memory cells can be read and data of the other memory cells cannot be read, in the case where the transistors 700 of the memory cells are connected to each other in parallel, a potential at which the transistor 700 is turned off regardless of a state of the gate electrode, that is, a potential lower than $V_{th\_H}$ may be supplied to the fifth wirings of the memory cells whose data is not to be read. Further, in the case where the transistors 700 of the memory cells are connected to each other in series, a potential at which the transistor 700 is turned on regardless of the state of the gate electrode, that is, a potential higher than $V_{th\_L}$ may be supplied to the fifth wirings of the memory cells whose data is not to be read.

Then, rewriting of data will be described. Rewriting of data is performed in a manner similar to that of the writing and holding of data. That is, the potential of the fourth wiring is set to a potential at which the transistor 710 is turned on, so that the transistor 710 is turned on. Accordingly, the potential of the third wiring (potential related to new data) is supplied to the gate electrode of the transistor 700 and the capacitor 720. After that, the potential of the fourth wiring is set to a potential at which the transistor 710 is turned off, and the transistor 710 is turned off. Accordingly, electric charge related to new data is held at the gate electrode of the transistor 700.

In the semiconductor device according to the invention disclosed herein, data can be directly rewritten by another writing of data as described above. Therefore, extracting of electric charge from a floating gate with the use of a high voltage, which is needed in a flash memory or the like, is not necessary, and thus, reduction in operation speed, which is attributed to erasing operation, can be suppressed. In other words, high-speed operation of the semiconductor device can be realized.

Note that the source electrode or the drain electrode of the transistor 710 is electrically connected to the gate electrode of the transistor 700, whereby an effect similar to that of a floating gate of a floating gate transistor used for a nonvolatile memory element can be achieved. Therefore, a portion in the drawing where the source electrode or the drain electrode of the transistor 710 is electrically connected to the gate electrode of the transistor 700 is called a floating gate portion FG in some cases. When the transistor 710 is off, the floating gate portion FG can be regarded as being embedded in an insulator and thus electric charge is held in the floating gate portion FG. The amount of the off-state current of the transistor 710 including an oxide semiconductor is less than or equal to one hundred thousandth of the amount of the off-state current of a transistor including a silicon semiconductor or the like; thus, lost of the electric charge accumulated in the floating gate portion FG due to leakage current of the transistor 710 is negligible. That is, with the use of the transistor 710 including an oxide semiconductor, a nonvolatile memory device that can hold data even when electric power is not supplied can be realized.

For example, when the off-state current of the transistor 710 at room temperature is less than or equal to 10 zA (1 zA (zeptoampere) is $1 \times 10^{-21}$ A) and the capacitance value of the capacitor 720 is approximately 10 fF, data can be held for at least $10^4$ seconds. It is needless to say that the holding time depends on transistor characteristics and the capacitance value.

Further, in this case, the problem of deterioration of a gate insulating film (tunnel insulating film), which is pointed out in a conventional floating gate transistor, does not exist. That is, the deterioration of a gate insulating film due to injection of an electron into a floating gate, which has been traditionally regarded as a problem, can be solved. This means that there is no limit on the number of times of writing in principle. Furthermore, a high voltage needed for writing or erasing in a conventional floating gate transistor is not necessary.

Figures 2, 13A:
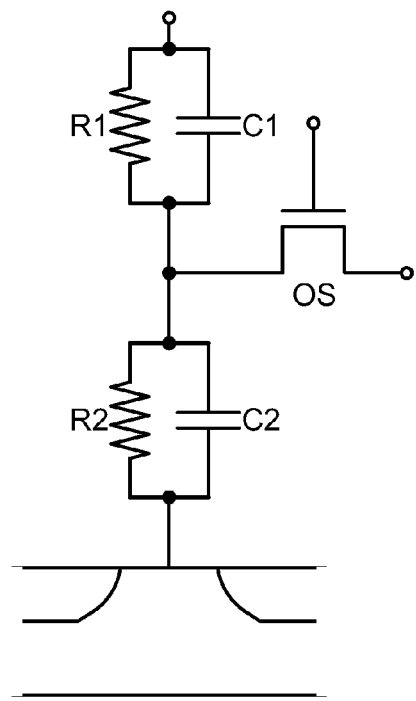

The components such as the transistors in the semiconductor device in FIG. 13A-1 can be regarded as including a resistor and a capacitor as illustrated in FIG. 13A-2. That is, in FIG. 13A-2, the transistor 700 and the capacitor 720 are each regarded as including a resistor and a capacitor. R1 and C1 denote the resistance value and the capacitance value of the capacitor 720. The resistance value R1 corresponds to the resistance value of an insulating layer included in the capacitor 720. In addition, R2 and C2 denote the resistance value and the capacitance value of the transistor 700. The resistance value R2 corresponds to the resistance value of a gate insulating layer at the time when the transistor 700 is on. The capacitance value C2 corresponds to the capacitance value of so-called gate capacitance (capacitance formed between a gate electrode and each of the source electrode and the drain electrode and capacitance formed between the gate electrode and a channel formation region).

The resistance value (also referred to as effective resistance) between the source electrode and the drain electrode when the transistor 710 is off is denoted by ROS. When R1 and R2 satisfy of R1≧ROS and R2≧ROS under the condition that gate leakage current of the transistor 710 is sufficiently small, a period for holding electric charge (also referred to as a data holding period) is determined mainly by the off-state current of the transistor 710.

On the other hand, when the condition is not satisfied, it is difficult to ensure an enough holding period even if the off-state current of the transistor 710 is sufficiently small. This is because a leakage current other than the off-state current of the transistor 710 (e.g., a leakage current generated between the source electrode and the gate electrode) is large. Thus, it can be said that the semiconductor device disclosed in this embodiment desirably satisfies the above relations.

Meanwhile, it is desirable that C1 and C2 satisfy a relation of C1≧C2. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be reduced.

When the above relations are satisfied, a more preferable semiconductor device can be realized. Note that R1 and R2 are controlled by the insulating layer of the capacitor 720 and the gate insulating layer of the transistor 700. The same applies to C1 and C2. Therefore, the material, the thickness, and the like of the gate insulating layer are desirably set as appropriate to satisfy the above relations.

In the semiconductor device described in this embodiment, the floating gate portion FG has an effect similar to that of a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent a potential of the high voltage from affecting a floating gate of the adjacent cell. This is one of inhibiting factors for high integration of the semiconductor device. The factor is attributed to a basic principle of a flash memory, in which a tunneling current flows by applying a high electrical field.

Further, because of the above principle of a flash memory, an insulating film deteriorates and thus another problem such as the limit on the number of times of rewriting (approximately $10^4$ to $10^5$ times) arises.

The semiconductor device according to the invention disclosed herein is operated by switching of a transistor including an oxide semiconductor and does not use the above-described principle of electric charge injection by a tunneling current. That is, a high electrical field for electric charge injection is not necessary unlike a flash memory. Accordingly, it is not necessary to consider an influence of a high electric field from a control gate on the adjacent cell, which facilitates high integration.

Further, electric charge injection by a tunneling current is not utilized, which means that there are no causes for deterioration of a memory cell. In other words, the semiconductor device according to the invention disclosed herein has higher durability and reliability than those of a flash memory.

In addition, the semiconductor device according to the invention disclosed herein has advantages over a flash memory in that a high electric field is unnecessary and a large peripheral circuit (such as a booster circuit) is unnecessary.

In the case where the relative dielectric constant ∈r1 of the insulating layer included in the capacitor 720 is different from the relative dielectric constant ∈2 of the gate insulating layer included in the transistor 700, it is easy to satisfy C1≧C2 while 2·S2≧S1 (desirably, S2 S1) is satisfied where S1 is the area of the insulating layer included in the capacitor 720 and S2 is the area of the gate insulating layer which causes generation of gate capacitance in the transistor 700. In other words, C1≧C2 can be easily satisfied while the area of the insulating layer included in the capacitor 720 is made small. Specifically, for example, a film formed of a high-k material such as hafnium oxide or a stack of a film formed of a high-k material such as hafnium oxide and a film formed of an oxide semiconductor is used for the insulating layer included in the capacitor 720 so that ∈r1 can be set to greater than or equal to 10, preferably greater than or equal to 15, and silicon oxide is used for the gate insulating layer which causes generation of gate capacitance so that ∈r2 can be set to 3 to 4.

Combination of such structures enables higher integration of the semiconductor device according to the invention disclosed herein.

Note that an n-channel transistor in which electrons are majority carriers is used in the above description; it is needless to say that a p-channel transistor in which holes are majority carriers can be used instead of the n-channel transistor.

As described above, the semiconductor device according to an embodiment of the invention disclosed herein has a nonvolatile memory cell including a writing transistor in which a leakage current between a source and a drain in an off state (off-state current) is small, a reading transistor formed of a semiconductor material different from that of the writing transistor, and a capacitor.

The off-state current of the writing transistor is less than or equal to 100 zA ($1 \times 10^{-19}$ A), preferably less than or equal to 10 zA ($1 \times 10^{-20}$ A), more preferably less than or equal to 1 zA ($1 \times 10^{-21}$ A) at ambient temperature (e.g., 25° C.). In the case of using a general silicon semiconductor, it is difficult to achieve a small off-state current as described above. However, in a transistor obtained by processing an oxide semiconductor under an appropriate condition, a small off-state current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, rising of a writing pulse supplied to the floating gate portion FG can be very sharp. Further, since the off-state current is small, the amount of electric charge held in the floating gate portion FG can be reduced. That is, by using the transistor including an oxide semiconductor as the writing transistor, rewriting of data can be performed at high speed.

As for the reading transistor, although there is no limitation on off-state current, it is desirable to use a transistor which operates at high speed in order to increase the reading rate. For example, a transistor with a switching rate of lower than or equal to 1 nanosecond is preferably used as the reading transistor.

In this manner, when a transistor including an oxide semiconductor is used as the writing transistor, and a transistor including a semiconductor material other than an oxide semiconductor is used as the reading transistor, a semiconductor device capable of holding data for a long time and reading data at high speed, which can be used as a memory device, can be obtained.

The structures, methods, and the like described in this embodiment can be combined as appropriate with any of the structures, methods, and the like described in other embodiments.

(Embodiment 5)

In this embodiment, application examples of a semiconductor device according to an embodiment of the invention disclosed herein will be described with reference to FIGS. 14A and 14B and FIGS. 15A to 15C.

Figure 14A:
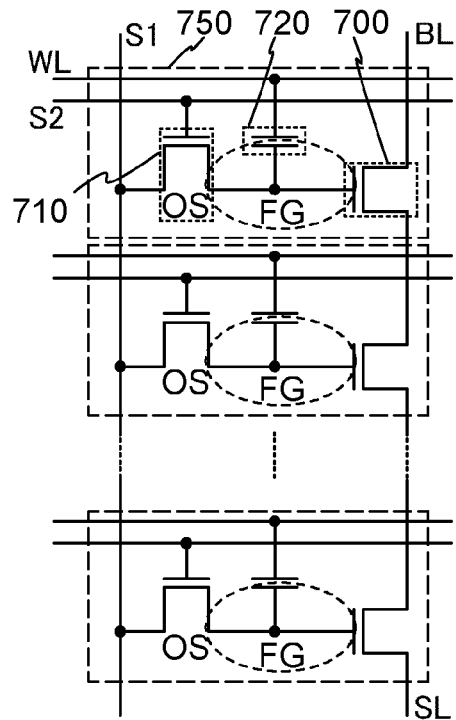
FIGS. 14A and 14B are circuit diagrams of a semiconductor device according to an embodiment.
Figure 14B:
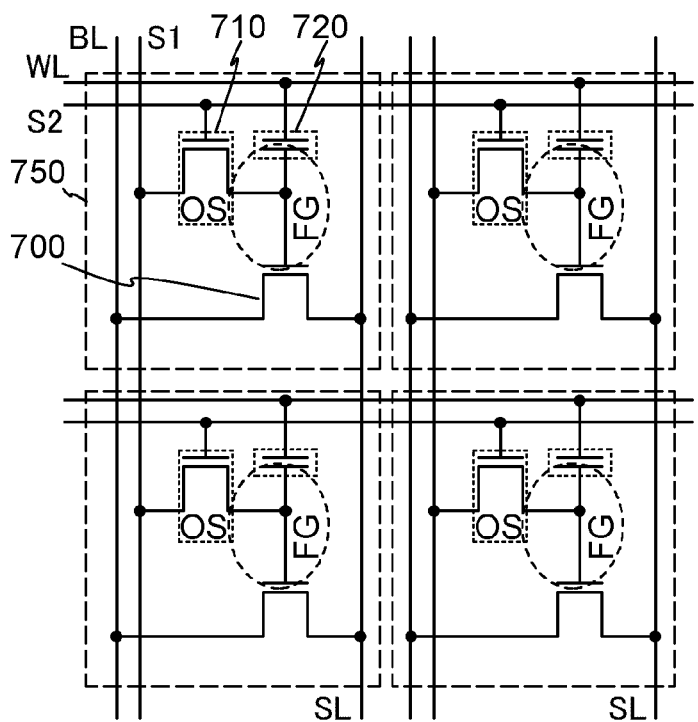

FIGS. 14A and 14B are each a circuit diagram of a semiconductor device including a plurality of the semiconductor devices illustrated in FIG. 13A-1 (hereinafter also referred to as memory cells 750). FIG. 14A is a circuit diagram of a so-called NAND semiconductor device in which the memory cells 750 are connected in series, and FIG. 14B is a circuit diagram of a so-called NOR semiconductor device in which the memory cells 750 are connected in parallel.

The semiconductor device in FIG. 14A includes a source line SL, a bit line BL, a first signal line S1, a plurality of second signal lines S2, a plurality of word lines WL, and a plurality of the memory cells 750. In FIG. 14A, one source line SL and one bit line BL are provided, but this embodiment is not limited to this. A plurality of source lines SL and a plurality of bit lines BL may be provided.

In each of the memory cells 750, a gate electrode of a transistor 700, one of a source electrode and a drain electrode of a transistor 710, and one electrode of a capacitor 720 are electrically connected to each other. The first signal line S1 and the other of the source electrode and the drain electrode of the transistor 710 are electrically connected to each other, and the second signal line S2 and a gate electrode of the transistor 710 are electrically connected to each other. The word line WL and the other electrode of the capacitor 720 are electrically connected to each other.

Further, a source electrode of the transistor 700 included in the memory cell 750 and a drain electrode of the transistor 700 included in the adjacent memory cell 750 are electrically connected to each other. The drain electrode of the transistor 700 included in the memory cell 750 and the source electrode of the transistor 700 included in the adjacent memory cell 750 are electrically connected to each other. Note that the drain electrode of the transistor 700 included in the memory cell 750 of the plurality of memory cells connected in series, which is provided at one of ends, is electrically connected to the bit line. In addition, the source electrode of the transistor 700 included in the memory cell 750 of the plurality of memory cells connected in series, which is provided at the other end, is electrically connected to the source line.

In the semiconductor device in FIG. 14A, writing operation and reading operation are performed in each row. The writing operation is performed as follows. A potential at which the transistor 710 is turned on is supplied to the second signal line S2 of a row where writing is to be performed, whereby the transistor 710 of the row where writing is to be performed is turned on. Accordingly, the potential of the first signal line S1 is supplied to the gate electrode of the transistor 700 in the specified row, so that a predetermined electric charge is supplied to the gate electrode of the transistor 700. Thus, data can be written to the memory cell of the specified row.

Further, the reading operation is performed as follows. First, a potential at which the transistor 700 is turned on regardless of electric charge supplied to the gate electrode thereof is supplied to the word lines WL of the rows other than the row where reading is to be performed, so that the transistors 700 of the rows other than the row where reading is to be performed are turned on. Then, a potential (reading potential) at which an on state or an off state of the transistor 700 is determined depending on electric charge in the gate electrode of the transistor 700 is supplied to the word line WL of the row where reading is to be performed. After that, a constant potential is supplied to the source line SL, so that a reading circuit (not illustrated) connected to the bit line BL is operated. Here, the plurality of transistors 700 between the source line SL and the bit line BL are turned on except the transistor 700 of the row where reading is to be performed; therefore, conductance between the source line SL and the bit line BL is determined by a state (an on state or an off state) of the transistor 700 of the row where reading is to be performed. Since the conductance of the transistor varies depending on the electric charge in the gate electrode of the transistor 700 of the row where reading is to be performed, a potential of the bit line BL also varies accordingly. By reading the potential of the bit line BL with the reading circuit, data can be read from the memory cell of the specified row.

The semiconductor device in FIG. 14B includes a plurality of source lines SL, a plurality of bit lines BL, a plurality of first signal lines S1, a plurality of second signal lines S2, a plurality of word lines WL, and a plurality of the memory cells 750. A gate electrode of a transistor 700, one of a source electrode and a drain electrode of a transistor 710, and one electrode of a capacitor 720 are electrically connected to each another. The source line SL and the source electrode of the transistor 700 are electrically connected to each other. The bit line BL and the drain electrode of the transistor 700 are electrically connected to each other. The first signal line S1 and the other of the source electrode and the drain electrode of the transistor 710 are electrically connected to each other, and the second signal line S2 and a gate electrode of the transistor 710 are electrically connected to each other. The word line WL and the other electrode of the capacitor 720 are electrically connected to each other.

In the semiconductor device in FIG. 14B, writing operation and reading operation are performed in each row. The writing operation is performed in a manner similar to that of the semiconductor device in FIG. 14A. The reading operation is performed as follows. First, a potential at which the transistor 700 is turned off regardless of electric charge supplied to the gate electrode thereof is supplied to the word lines WL of the rows other than the row where reading is to be performed, so that the transistors 700 of the rows other than the row where reading is to be performed are turned off. Then, a potential (reading potential) at which an on state or an off state of the transistor 700 is determined depending on electric charge in the gate electrode of the transistor 700 is supplied to the word line WL of the row where reading is to be performed. After that, a constant potential is supplied to the source line SL so that a reading circuit (not illustrated) connected to the bit line BL is operated. Here, conductance between the source line SL and the bit line BL is determined by a state (an on state or an off state) of the transistor 700 of the row where reading is to be performed. That is, a potential of the bit line BL depends on electric charge in the gate electrode of the transistor 700 of the row where reading is to be performed. By reading the potential of the bit line BL with the reading circuit, data can be read from the memory cell of the specified row.

Although the amount of data which can be stored in each of the memory cells 750 is one bit in the above description, the structure of the memory device of this embodiment is not limited to this. The amount of data which is held in each of the memory cells 750 may be increased by preparing three or more kinds of potentials to be supplied to the gate electrode of the transistor 700. For example, in the case where four kinds of potentials are supplied to the gate electrode of the transistor 700, data of two bits can be held in each of the memory cells.

Next, examples of the reading circuit which can be used for the semiconductor devices in FIGS. 14A and 14B, or the like will be described with reference to FIGS. 15A to 15C.

Figure 15A:
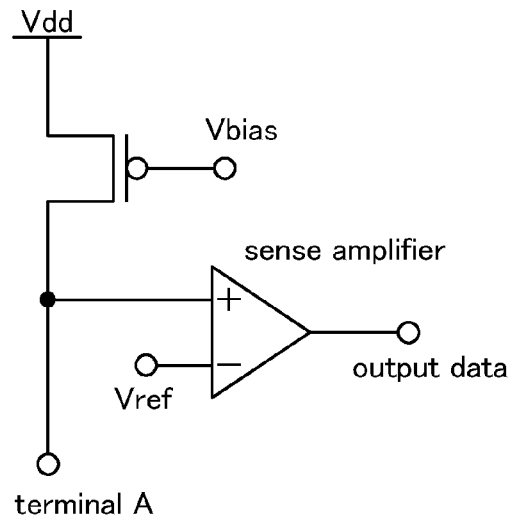
FIGS. 15A to 15C are circuit diagrams of a semiconductor device according to an embodiment.

FIG. 15A illustrates a schematic of the reading circuit. The reading circuit includes a transistor and a sense amplifier circuit.

At the time of reading data, a terminal A is connected to a bit line to which a memory cell from which data is read is connected. Further, a bias potential Vbias is applied to a gate electrode of the transistor so that a potential of the terminal A is controlled.

The resistance of the memory cell 750 varies depending on data to be stored. Specifically, when the transistor 700 of the selected memory cell 750 is on, the memory cell 750 has low resistance, whereas when the transistor 700 of the selected memory cell 750 is off, the memory cell 750 has high resistance.

When the memory cell has high resistance, a potential of the terminal A is higher than a reference potential Vref and the sense amplifier circuit outputs a potential corresponding to the potential of the terminal A. On the other hand, when the memory cell has low resistance, the potential of the terminal A is lower than the reference potential Vref and the sense amplifier circuit outputs a potential corresponding to the potential of the terminal A.

Thus, by using the reading circuit, data can be read from the memory cell. Note that the reading circuit of this embodiment is one of examples. Another circuit may be used. The reading circuit may further include a precharge circuit. Instead of the reference potential Vref, a reference bit line may be connected to the sense amplifier circuit.

Figure 15B:
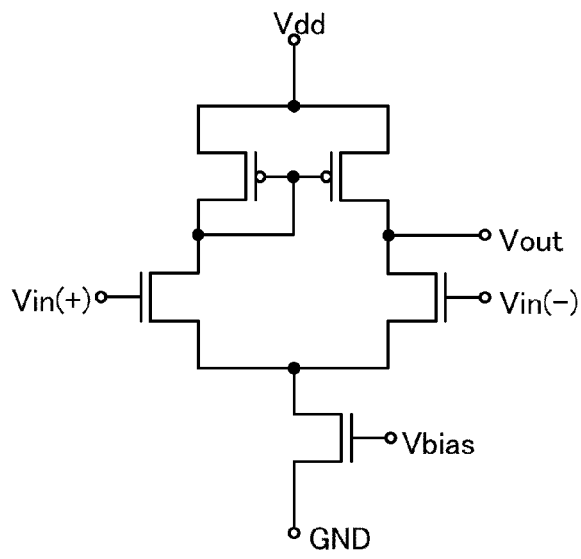

FIG. 15B illustrates a differential sense amplifier which is an example of the sense amplifier circuit. The differential sense amplifier has an input terminal Vin (+) and an input terminal Vin (−), and an output terminal Vout, and amplifies the difference between Vin (+) and Vin (−). Vout is approximately high output when Vin (+)>Vin (−), and is approximately low output when Vin (+)<Vin (−). In the case where the differential sense amplifier is used for the reading circuit, one of Vin (+) and Vin (−) is connected to the input terminal A, and the reference potential Vref is supplied to the other of Vin (+) and Vin (−).

Figure 15C:
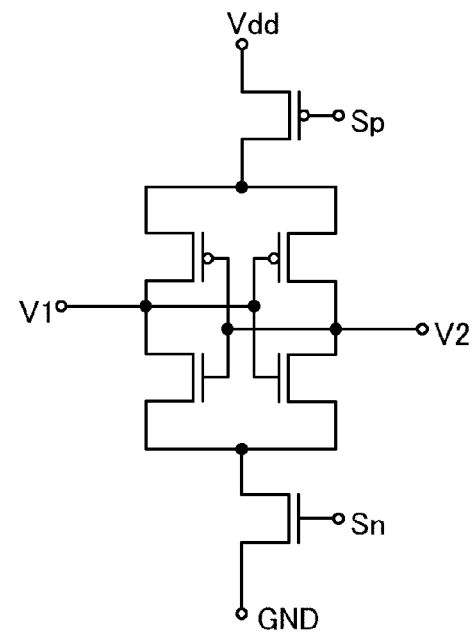

FIG. 15C illustrates a latch sense amplifier which is an example of the sense amplifier circuit. The latch sense amplifier has input/output terminals V1 and V2 and input terminals of control signals Sp and Sn. First, the control signals Sp and Sn are set to high and low, respectively, and a power supply potential (Vdd) is interrupted. Then, potentials to be compared are supplied to V1 and V2. After that, the signals Sp and Sn are set to low and high, respectively, and a power supply potential (Vdd) is supplied. If the potentials V1in and V2in to be compared satisfy a relation of V1in>V2in, output of the V1 is high and output of the V2 is low, whereas if the potentials satisfy a relation of V1in<V2in, the output of V1 is low and the output of V2 is high. By utilizing such relations, the difference between V1in and V2in can be amplified. In the case where the latch sense amplifier is used for the reading circuit, one of V1 and V2 is connected to the terminal A and the output terminal through a switch, and the reference potential Vref is supplied to the other of V1 and V2.

The methods, the structures, and the like described in this embodiment can be combined as appropriate with any of the methods, the structures, and the like described in other embodiments.

(Embodiment 6)

In this embodiment, examples of an electronic device to which the semiconductor device described in any of the above embodiments is applied will be described with reference to FIGS. 16A to 16F. In this embodiment, examples of the electronic device to which the semiconductor device described in any of the above embodiments is applied include a computer, a mobile phone handset (also referred to as a mobile phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 16A:
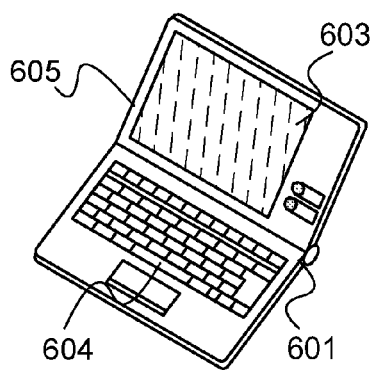
FIGS. 16A to 16F are diagrams illustrating electronic devices each including a semiconductor device according to an embodiment.

FIG. 16A illustrates a laptop personal computer which includes a housing 601, a housing 605, a display portion 603, a keyboard 604, and the like. In at least one of the housing 601 and the housing 605, the semiconductor device of the above embodiment which is provided with a combination of a transistor including an oxide semiconductor and a transistor including a semiconductor material other than an oxide semiconductor is provided. Therefore, a laptop personal computer capable of holding data for a long time and reading data at high speed can be obtained.

Figure 16D:
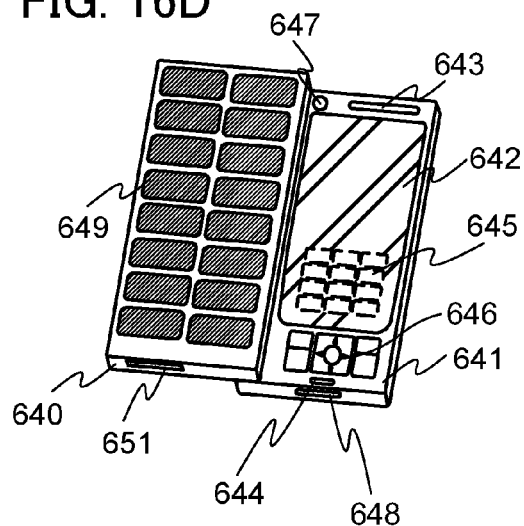
Figure 16B:
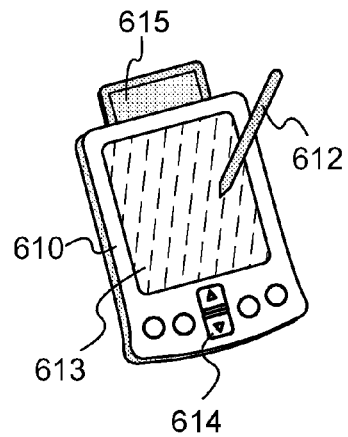

FIG. 16B illustrates a personal digital assistant (PDA) which includes a main body 610 provided with a display portion 613, an external interface 615, operation buttons 614, and the like. In addition, a stylus 612 which controls the personal digital assistant and the like are provided. In the main body 610, the semiconductor device of the above embodiment which is provided with a combination of a transistor including an oxide semiconductor and a transistor including a semiconductor material other than an oxide semiconductor is provided. Therefore, a personal digital assistant capable of holding data for a long time and reading data at high speed can be obtained.

Figure 16E:
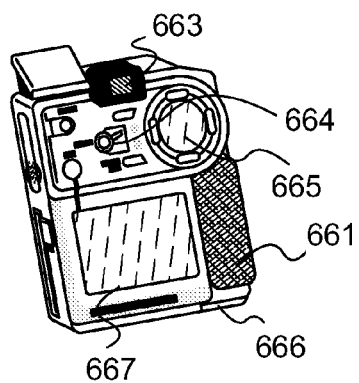
Figure 16C:
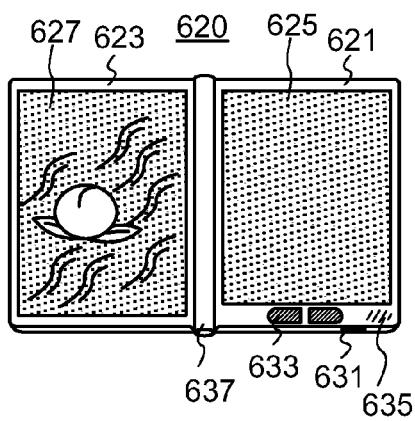

FIG. 16C illustrates an electronic book reader 620 which includes an electronic paper and two housings, a housing 621 and a housing 623. The housing 621 and the housing 623 are respectively provided with a display portion 625 and a display portion 627. The housing 621 is combined with the housing 623 by a hinge 637, so that the electronic book reader 620 can be opened and closed using the hinge 637 as an axis. The housing 621 is provided with a power button 631, operation keys 633, a speaker 635, and the like. In at least one of the housing 621 and the housing 623, the semiconductor device of the above embodiment which is provided with a combination of a transistor including an oxide semiconductor and a transistor including a semiconductor material other than an oxide semiconductor is provided. Therefore, an electronic book reader capable of holding data for a long time and reading data at high speed can be obtained.

FIG. 16D illustrates a mobile phone which includes two housings, a housing 640 and a housing 641. The housing 640 and the housing 641 in a state where they are developed as illustrated in FIG. 16D can shift by sliding to a state where one is lapped over the other. Therefore, the size of the mobile phone can be reduced, which makes the mobile phone suitable for being carried around. The housing 641 includes a display panel 642, a speaker 643, a microphone 644, a pointing device 646, a camera lens 647, an external connection terminal 648, and the like. The housing 640 includes a solar cell 649 for charging the mobile phone, an external memory slot 651, and the like. The display panel 642 is equipped with a touch panel function. A plurality of operation keys 645 displayed as images are indicated by dashed lines in FIG. 16D. In addition, an antenna is incorporated in the housing 641. In at least one of the housing 640 and the housing 641, the semiconductor device of the above embodiment which is provided with a combination of a transistor including an oxide semiconductor and a transistor including a semiconductor material other than an oxide semiconductor is provided. Therefore, a mobile phone capable of holding data for a long time and reading data at high speed can be obtained.

FIG. 16E illustrates a digital camera which includes a main body 661, a display portion 667, an eyepiece portion 663, an operation switch 664, a display portion 665, a battery 666, and the like. In the main body 661, the semiconductor device of the above embodiment which is provided with a combination of a transistor including an oxide semiconductor and a transistor including a semiconductor material other than an oxide semiconductor is provided. Therefore, a digital camera capable of holding data for a long time and reading data at high speed can be obtained.

Figure 16F:
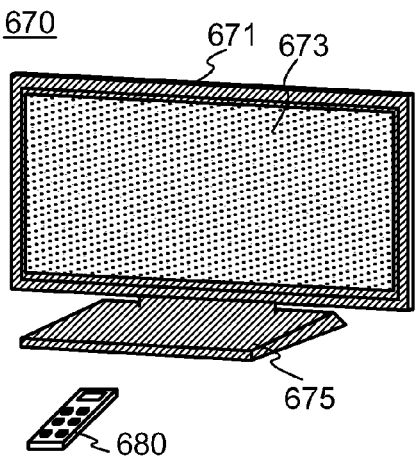

FIG. 16F illustrates a television device 670 which includes a housing 671, a display portion 673, a stand 675, and the like. The television device 670 can be operated with a switch of the housing 671 or a remote controller 680. In at least one of the housing 671 and the remote controller 680, the semiconductor device of the above embodiment which is provided with a combination of a transistor including an oxide semiconductor and a transistor including a semiconductor material other than an oxide semiconductor is provided. Therefore, a television device capable of holding data for a long time and reading data at high speed can be obtained.

As described above, the electronic device described in this embodiment includes the semiconductor device according to any of the above embodiments.

Therefore, an electronic device having characteristics of being small, high-speed operation, and low power consumption can be realized.

EXAMPLE 1

In this example, a method in which an oxide semiconductor layer is purified to have an extremely high purity will be described along with analysis results obtained by secondary ion mass spectrometry. In the method, oxygen having high energy is added to the oxide semiconductor layer by an ion implantation method and then heat treatment is performed on the oxide semiconductor layer.

A method for manufacturing a highly purified oxide semiconductor layer, which was manufactured in this example, will be described with reference FIGS. 10A to 10E.

<Manufacturing Method of Sample 1>

Sample 1 includes an oxide semiconductor layer 413a before being highly purified. A method for manufacturing Sample 1 is described below.

As a substrate 400, glass with a thickness of 0.7 mm was used. Over the substrate 400, a film of silicon oxynitride ($SiO_xN_y$, x>y) with a thickness of 100 nm was formed as an insulating film 401 by a plasma CVD method (see FIG. 10A).

Then, the oxide semiconductor layer 413a with a thickness of 200 nm was formed over the insulating film 401 by using an In—Ga—Zn—O-based oxide target by a sputtering method. As the target, an oxide target containing indium (In), gallium (Ga), and zinc (Zn) was used. The composition ratio of metals contained in the oxide target was In:Ga:Zn=1:1:0.5 [atomic ratio], and the filling rate of the oxide target was higher than or equal to 95% and lower than or equal to 100%.

The oxide semiconductor layer 413a was formed in a deposition chamber which was provided with a cryopump as an evacuation unit. The deposition conditions were as follows: the distance between the substrate and the target was 60 mm, the pressure was 0.4 Pa, the electric power of a direct-current (DC) power source was 0.5 kW, and an argon gas with a flow of 30 sccm and an oxygen gas with a flow of 15 sccm were supplied as a deposition gas to the deposition chamber.

In accordance with the above method, Sample 1 in which the oxide semiconductor layer 413a was provided over the insulating film 401 that was over the substrate 400 was formed (see FIG. 10B).

<Manufacturing Method of Sample 2>

Sample 2 includes an oxide semiconductor layer 413b to which oxygen was added. A method for manufacturing Sample 2 is described below.

Oxygen ions were implanted with the use of an ion implantation apparatus to the oxide semiconductor layer 413a which was formed by a method similar to that of Sample 1, whereby the oxide semiconductor layer 413b to which oxygen was added was formed. The implantation amount of oxygen ions was set to $1\times10^{16}$ [ions/cm$^2$], the acceleration energy was set to 50 keV, and the implantation angle with respect to the sample was set to 7° (see FIG. 10C). In this example, ions of oxygen whose mass number was 18 ($^{18}$O ions) were implanted, but the mass number is not limited to 18. Distribution of ions of oxygen whose mass number was 18 ($^{18}$O ions) in the oxide semiconductor layer can be measured using secondary ion mass spectrometry (SIMS).

<Manufacturing Method of Sample 3>

Sample 3 includes an oxide semiconductor layer 413c obtained by performing heat treatment after addition of oxygen. A method for manufacturing Sample 3 is described below.

The oxide semiconductor layer 413b formed by a method similar to that of Sample 2, to which oxygen was added, was heated at 600° C. for 60 minutes in a nitrogen atmosphere, whereby the oxide semiconductor layer 413c obtained by performing heat treatment after addition of oxygen was formed (see FIG. 10D).

<Manufacturing Method of Comparative Sample 1>

Comparative Sample 1 includes an oxide semiconductor layer obtained by performing heat treatment without addition of oxygen to Sample 1. A method for manufacturing Comparative Sample 1 is described below.

The oxide semiconductor layer 413a before being highly purified was heated at 600° C. for 60 minutes in a nitrogen atmosphere, whereby an oxide semiconductor layer 413d obtained by performing only heat treatment was formed (see FIG. 10E).

<Analysis Result 1 by Secondary Ion Mass Spectrometry>

Figure 11:
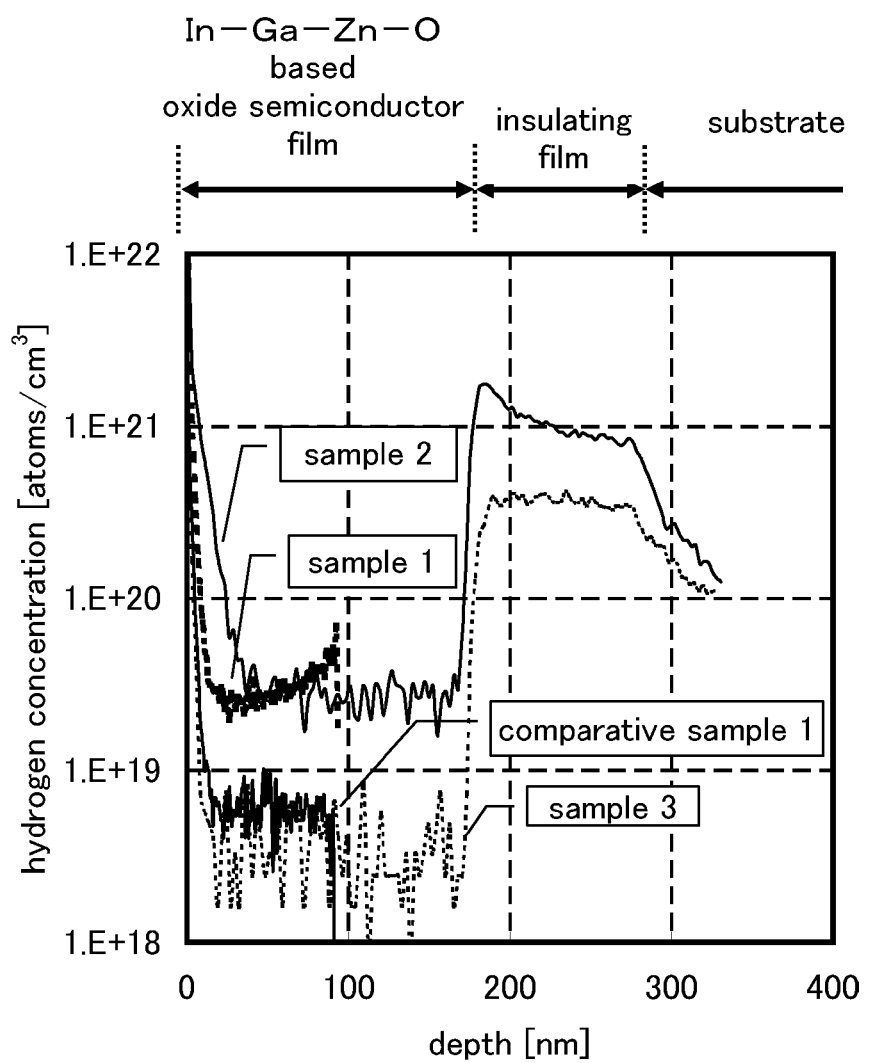
FIG. 11 is a graph showing a result of performing secondary ion mass spectrometry on a sample according to an example.

The hydrogen concentration in the oxide semiconductor layer in each of Samples 1 to 3 and Comparative Sample 1 was measured by secondary ion mass spectrometry. FIG. 11 shows the measurement results. In FIG. 11, the vertical axis represents the hydrogen concentration, and the horizontal axis represents the depth from a surface (the film thickness).

Note that the measurement results of secondary ion mass spectrometry have an effective range. The effective range of the measurement results of secondary ion mass spectrometry depends on the measurement conditions, manufacturing conditions of thr samples, and the like. In this example, the lower limit for measurement of the hydrogen concentration in the oxide semiconductor layer is about $2\times10^{18}$ [ions/cm$^3$].

Regarding the results shown in FIG. 11, at the surface of the oxide semiconductor layer (a region from the surface to a depth of greater than or equal to 0 nm and less than 10 nm) and at the interface between the oxide semiconductor layer and the insulating film 401 (a region from a depth of greater than or equal to 165 nm to a depth of less than 185 nm), accurate values are difficult to be evaluated. Therefore, in the case of this example, the effective range of the measurement results of secondary ion mass spectrometry is set to a region from a depth of greater than or equal to 10 nm to a depth of less than 165 nm.

The results of measuring the hydrogen concentration in the oxide semiconductor layers in Samples 1 to 3 and Comparative Sample 1 are shown in Table 1.

TABLE 1

| Name of Sample | Hydrogen Concentration [atoms/cm$^3$] |
| --- | --- |
| Sample 1 | $3\times10^{19}$ |
| Sample 2 | $3\times10^{19}$ |

TABLE 1-continued

| Name of Sample | Hydrogen Concentration [atoms/cm$^3$] |
| --- | --- |
| Sample 3 | lower than or equal to lower limit for measurement |
| Comparative Sample 1 | $6\times10^{18}$ |

The hydrogen concentration in the oxide semiconductor layer of Sample 1 was about $3\times10^{19}$ [ions/cm$^3$]. The hydrogen concentration in the oxide semiconductor layer of Sample 2, which was obtained by adding oxygen to the oxide semiconductor layer in Sample 1, was about $3\times10^{19}$ [ions/cm$^3$]. The hydrogen concentration in the oxide semiconductor layer of Sample 3, which was obtained by performing heat treatment on Sample 2, was lower than or equal to about $1\times10^{18}$ [ions/cm$^3$] which was lower than or equal to the lower limit for measurement. The hydrogen concentration in the oxide semiconductor layer of Comparative Sample 1, which was obtained by performing heat treatment on Sample 1, was about $6\times10^{18}$ [ions/cm$^3$].

This example shows that the hydrogen concentration in Sample 3 is lower than that in Comparative Sample 1.

According to the above results, a method in which oxygen is added to the oxide semiconductor layer and the oxide semiconductor layer is subjected to heat treatment is more effective in reducing the hydrogen concentration in the oxide semiconductor layer as compared to a method in which the oxide semiconductor layer is just subjected to heat treatment.

By using the method described in this example, oxygen was added to the oxide semiconductor layer and then the oxide semiconductor layer was subjected to heat treatment so as to remove impurities remaining in the oxide semiconductor layer, whereby the oxide semiconductor layer could be purified to have an extremely high purity.

<Analysis Result 2 by Secondary Ion Mass Spectrometry>

The concentrations of oxygen whose mass number was 16 and oxygen whose mass number was 18 in the oxide semiconductor layers in Samples 2 to 4 were measured by secondary ion mass spectrometry.

<Manufacturing Method of Sample 4>

Sample 4 includes an oxide semiconductor layer obtained by performing heat treatment after addition of oxygen. A method for manufacturing Sample 4 is described below.

An oxide semiconductor layer to which oxygen was added was formed by a method similar to that of Sample 2 and heated at 650° C. for 60 minutes in a nitrogen atmosphere, whereby the oxide semiconductor layer obtained by performing heat treatment after addition of oxygen was formed.

Figure 12:
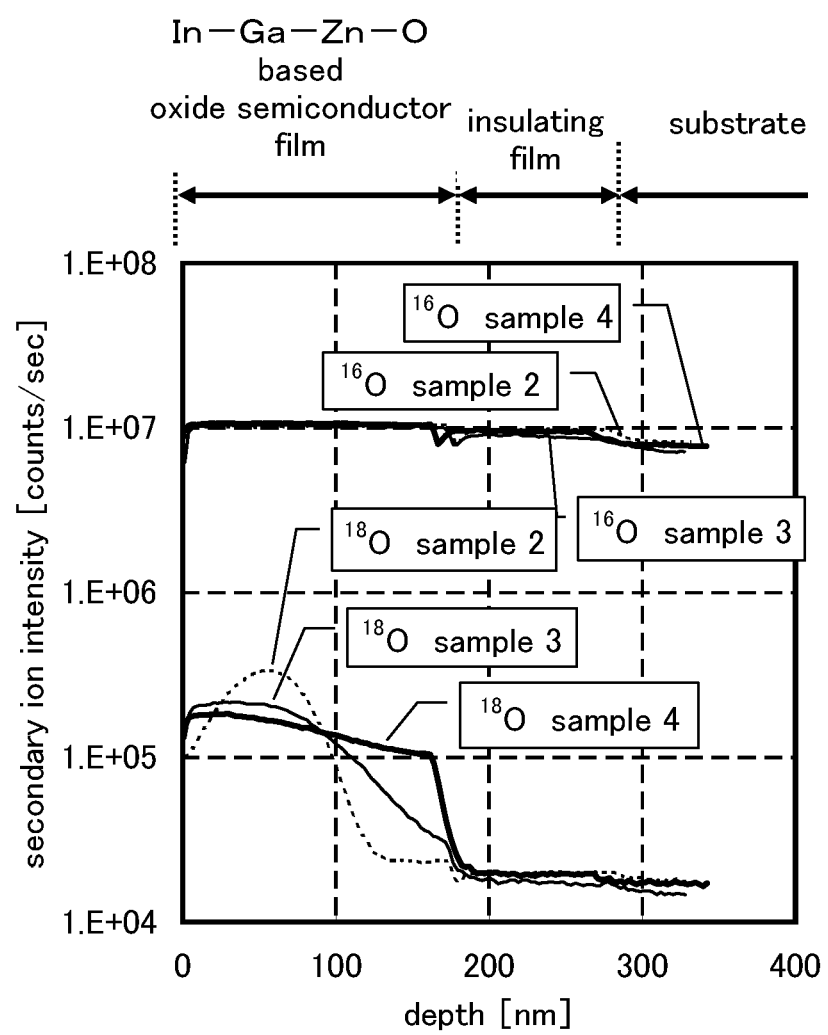
FIG. 12 is a graph showing a result of performing secondary ion mass spectrometry on a sample according to an example.

The results are shown in FIG. 12. In FIG. 12, the vertical axis represents secondary ion intensity originated from oxygen ions which is an index of the oxygen concentrations in the oxide semiconductor layers. The horizontal axis represents the depth from a surface (the film thickness). Oxygen whose mass number is 16 is a main component of an In—Ga—Zn—O-based oxide semiconductor layer and its secondary ion intensity was strong in the oxide semiconductor layers of Samples 2 to 4.

A most part of detected oxygen whose mass number is 18 is derived from oxygen ions implanted by the ion implantation apparatus. In Sample 2, the oxygen ions implanted to the oxide semiconductor layer have a peak at a depth of around 50 nm In Sample 3 obtained by performing heating at 600° C., oxygen whose mass number is 18 is widely distributed. Further, in Sample 4 obtained by performing heating at 650° C., oxygen whose mass number is 18 is more widely distributed.

These results show that the implanted oxygen ions diffused in the oxide semiconductor layer by heating.

In addition, since the implanted oxygen ions diffused throughout the oxide semiconductor layer by heating and its concentration was averaged, it was found that the implanted oxygen ions existed stably in the oxide semiconductor layer and were difficult to be released from the surface of the oxide semiconductor layer.

Therefore, it was confirmed that oxygen added to the oxide semiconductor layer with the use of the ion implantation apparatus or the like can compensate for oxygen deficiency generated in the oxide semiconductor layer.

EXAMPLE 2

In this example, a method in which an oxide semiconductor layer was purified to have an extremely high purity will be described. Specifically, oxygen having high energy was added to the oxide semiconductor layer by an ion implantation method and then the oxide semiconductor layer was subjected to heat treatment so as to be purified to have an extremely high purity. The results thereof will be described along with the results obtained by low-temperature photoluminescence spectroscopy.

<Manufacturing Method of Sample 5>

Sample 5 described in this example includes an oxide semiconductor layer over a quartz substrate. In addition, oxygen is added to the oxide semiconductor layer with the use of an ion implantation apparatus, and further, the oxide semiconductor layer is subjected to heat treatment. A method for manufacturing Sample 5 is described in detail below.

An oxide semiconductor layer with a thickness of 100 nm was formed over a quartz substrate with a thickness of 0.7 mm by a sputtering method. As a target, an oxide target containing indium (In), gallium (Ga), and zinc (Zn) was used. The composition ratio of metals contained in the oxide target was In:Ga:Zn=1:1:1 [atomic ratio], and the filling rate of the oxide target was higher than or equal to 95% and lower than or equal to 100%.

The oxide semiconductor layer was formed under the following conditions: the distance between the substrate and the target was 60 mm, the pressure was 0.4 Pa, and the electric power of a direct-current (DC) power source was 0.5 kW. In addition, an argon gas with a flow of 30 sccm and an oxygen gas with a flow of 15 sccm were supplied as a deposition gas to a deposition chamber provided with a cryopump as an evacuation unit.

Then, oxygen ions were implanted to the oxide semiconductor layer with the use of the ion implantation apparatus. The implantation amount of oxygen ions was set to $1\times10^{16}$ [ions/cm$^2$], the acceleration energy was set to 50 keV, and the implantation angle with respect to the sample was set to 7°. In this example, ions of oxygen whose mass number was 18 ($^{18}$O ions) were implanted, but the mass number is not limited to 18.

The oxide semiconductor layer to which the oxygen ions were implanted was subjected to heat treatment. The heat treatment was performed at 650° C. for one hour in a nitrogen atmosphere with the use of a vertical furnace. Through the foregoing steps, Sample 5 was manufactured.

<Manufacturing Method of Comparative Sample 2>

Comparative Sample 2 includes an oxide semiconductor layer over a quartz substrate, which was obtained by performing just heat treatment. A method for manufacturing Comparative Sample 2 is described below.

First, an oxide semiconductor layer with a thickness of 100 nm was formed over a quartz substrate with a thickness of 0.7 mm by a sputtering method in a manner similar to that of Sample 5.

Then, heat treatment was performed without implantation of oxygen ions. Heat treatment was performed at 650° C. for one hour in a nitrogen gas atmosphere with the use of a vertical furnace. Through the foregoing steps, Comparative Sample 2 was manufactured.

<Result of Low-Temperature Photoluminescence Spectroscopy>

Figure 17:
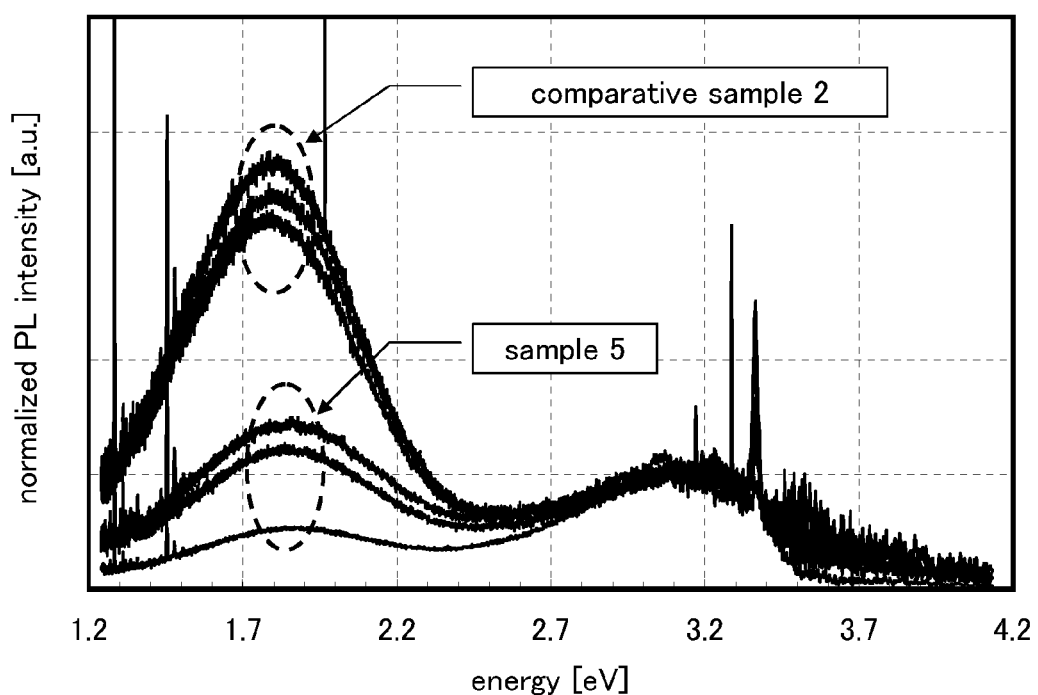
FIG. 17 is a graph showing a result of performing low-temperature photoluminescence spectroscopy on a sample according to an example.

Low-temperature photoluminescence spectroscopy was performed on three regions of each of Sample 5 and Comparative Sample 2. The sample placed in a helium gas at a temperature of 10 K was irradiated with light (He—Cd laser light) with a wavelength of 325 nm as excitation light, and then, photoluminescence was measured. Spectroscopy was performed on light emitted from Comparative Sample 2 or Sample 5, and its intensity was plotted using a value obtained by converting a wavelength of the light into energy. FIG. 17 shows the result of performing measurement on three regions of each sample.

Light emission having an energy of about 1.8 eV was obtained from Sample 5 and Comparative Sample 2. The light emission intensity of Sample 5 was lower than that of Comparative Sample 2. It was confirmed that a round peak around 3.1 eV was a light emission peak derived from the quartz substrate and was not light emission from the oxide semiconductor layer. Note that light emission having an energy of about 1.8 eV was light emission from a trap level formed due to oxygen deficiency in the oxide semiconductor. That is, light emission from a trap level due to oxygen deficiency of Sample 5 was weaker than that of Comparative Sample 2.

Accordingly, it was confirmed that the number of trap levels due to oxygen deficiency of Sample 5 was smaller than that of Comparative Sample 2. That is, it was confirmed that, in the oxide semiconductor layer to which oxygen was added with the use of the ion implantation apparatus and which was subjected to heat treatment, oxygen deficiency could be reduced as compared to the oxide semiconductor layer which was subjected to heat treatment without addition of oxygen with the use the ion implantation apparatus.

This application is based on Japanese Patent Application serial no. 2010-043555 filed with Japan Patent Office on Feb. 26, 2010, the entire contents of which are hereby incorporated by reference.

The invention claimed is:

1. A method for manufacturing a semiconductor device, comprising the steps of:
   forming an oxide semiconductor layer;
   performing addition of oxygen on an entirety of top surface of the oxide semiconductor layer by an ion implantation method or an ion doping method so as to cut a bond between hydrogen and metal contained in the oxide semiconductor layer, a bond between metal and hydroxyl group, or a bond between hydrogen and oxygen in hydroxyl group bonded to metal; and
   performing heat treatment at higher than or equal to 250° C. and lower than or equal to 700° C. on the oxide semiconductor layer after performing the addition of oxygen.

2. The method for manufacturing a semiconductor device, according to claim 1, further comprising the step of:
   before forming the oxide semiconductor layer, forming an insulating film over a transistor,
   wherein the oxide semiconductor layer is formed over the insulating film.

3. The method for manufacturing a semiconductor device, according to claim 1, further comprising the step of:
before performing the addition of oxygen, performing a second heat treatment on the oxide semiconductor layer.

4. The method for manufacturing a semiconductor device, according to claim 1, wherein the oxide semiconductor layer comprises an In-Ga-Zn-O based oxide semiconductor.

5. The method for manufacturing a semiconductor device, according to claim 1, wherein the oxide semiconductor layer is formed by a sputtering method using $In_2O_3$, $Ga_2O_3$, and ZnO.

6. A method for manufacturing a semiconductor device, comprising the steps of:
forming a gate electrode;
forming a gate insulating layer over the gate electrode;
forming an oxide semiconductor layer overlapping with the gate electrode so as to be in contact with the gate insulating layer;
performing addition of oxygen on an entirety of top surface of the oxide semiconductor layer by an ion implantation method or an ion doping method so as to cut a bond between hydrogen and metal contained in the oxide semiconductor layer, a bond between metal and hydroxyl group, or a bond between hydrogen and oxygen in hydroxyl group bonded to metal;
performing heat treatment on the oxide semiconductor layer after performing the addition of oxygen;
a source electrode and a drain electrode whose end portions overlap with the gate electrode so as to be in contact with the oxide semiconductor layer after performing the heat treatment; and
forming an insulating layer so as to be in contact with and overlap with a channel formation region of the oxide semiconductor layer.

7. The method for manufacturing a semiconductor device, according to claim 6, wherein the insulating layer is a silicon oxide layer formed by a sputtering method.

8. The method for manufacturing a semiconductor device, according to claim 6, further comprising the step of:
forming a silicon nitride layer over the insulating layer formed by a sputtering method,
wherein the insulating layer is a silicon oxide layer formed by a sputtering method.

9. The method for manufacturing a semiconductor device, according to claim 6, further comprising the step of:
before forming the oxide semiconductor layer, forming an insulating film over a transistor,
wherein the oxide semiconductor layer is formed over the insulating film.

10. The method for manufacturing a semiconductor device, according to claim 6, further comprising the step of:
before performing the addition of oxygen, performing a second heat treatment on the oxide semiconductor layer.

11. The method for manufacturing a semiconductor device, according to claim 6,
wherein the oxide semiconductor layer comprises an In-Ga-Zn-O based oxide semiconductor, and
wherein the gate electrode comprises titanium.

12. The method for manufacturing a semiconductor device, according to claim 6, wherein the oxide semiconductor layer is formed by a sputtering method using $In_2O_3$, $Ga_2O_3$, and ZnO.

13. A method for manufacturing a semiconductor device, comprising the steps of:
forming a source electrode and a drain electrode;
forming an oxide semiconductor layer overlapping with an end portion of the source electrode and an end portion of the drain electrode;
performing addition of oxygen on an entirety of top surface of the oxide semiconductor layer by an ion implantation method or an ion doping method;
performing heat treatment on the oxide semiconductor layer after performing the addition of oxygen;
forming a gate insulating layer overlapping with the end portion of the source electrode and the end portion of the drain electrode to be in contact with the oxide semiconductor layer after performing the heat treatment; and
forming a gate electrode overlapping with the end portion of the source electrode and the end portion of the drain electrode so as to be in contact with the gate insulating layer, forming an insulating layer over the gate electrode.

14. The method for manufacturing a semiconductor device, according to claim 13, wherein the gate insulating layer is a silicon oxide layer formed by a sputtering method.

15. The method for manufacturing a semiconductor device, according to claim 13,
wherein the gate insulating layer is a stack of a silicon oxide layer and a silicon nitride layer over the silicon oxide layer, and
wherein the silicon oxide layer and the silicon nitride layer are formed by a sputtering method.

16. The method for manufacturing a semiconductor device, according to claim 13, further comprising the step of:
before forming the oxide semiconductor layer, forming an insulating film over a transistor,
wherein the oxide semiconductor layer is formed over the insulating film.

17. The method for manufacturing a semiconductor device, according to claim 13, further comprising the step of:
before performing the addition of oxygen, performing a second heat treatment on the oxide semiconductor layer.

18. The method for manufacturing a semiconductor device, according to claim 13,
wherein the oxide semiconductor layer comprises an In-Ga-Zn-O based oxide semiconductor, and
wherein the gate electrode comprises titanium.

19. The method for manufacturing a semiconductor device, according to claim 13, wherein the oxide semiconductor layer is formed by a sputtering method using $In_2O_3$, $Ga_2O_3$, and ZnO.

* * * * *

UNITED STATES PATENT AND TRADEMARK OFFICE
CERTIFICATE OF CORRECTION

PATENT NO. : 8,518,755 B2
APPLICATION NO. : 13/029173
DATED : August 27, 2013
INVENTOR(S) : Shunpei Yamazaki et al.

It is certified that error appears in the above-identified patent and that said Letters Patent is hereby corrected as shown below:

In the Specification:

At column 35, line 9, "FG" should be --FG.--;

At column 36, line 55, "$\in 2$" should be --$\in r2$--;

At column 36, line 57, "(desirably, S2 S1)" should be --(desirably, $S2 \geqq S1$)--;

At column 38, line 4, "51" should be --S1--;

At column 38, line 13, "51" should be --S1--;

In the Claims:

At Claim 6, column 47, line 28, "a source" should be --forming a source--.

Signed and Sealed this
Twenty-sixth Day of November, 2013

Margaret A. Focarino
*Commissioner for Patents of the United States Patent and Trademark Office*